(12) United States Patent
Shin et al.

(10) Patent No.: US 10,644,019 B2
(45) Date of Patent: May 5, 2020

(54) SEMICONDUCTOR DEVICE

(71) Applicant: SAMSUNG ELECTRONICS CO., LTD., Suwon-si, Gyeonggi-do (KR)

(72) Inventors: Yoo-cheol Shin, Hwaseong-si (KR);
Young-woo Park, Hwasung (KR);
Jae-duk Lee, Seongnam-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 16/396,027

(22) Filed: Apr. 26, 2019

(65) Prior Publication Data
US 2019/0252401 A1    Aug. 15, 2019

Related U.S. Application Data

(63) Continuation of application No. 15/869,888, filed on Jan. 12, 2018, now Pat. No. 10,381,370, which is a
(Continued)

(30) Foreign Application Priority Data

Nov. 8, 2013    (KR) .......................... 10-2013-0135837

(51) Int. Cl.
*H01L 27/11578* (2017.01)
*H01L 27/11526* (2017.01)
(Continued)

(52) U.S. Cl.
CPC .... *H01L 27/11578* (2013.01); *H01L 27/1157* (2013.01); *H01L 27/11526* (2013.01);
(Continued)

(58) Field of Classification Search
CPC ......... H01L 27/11578; H01L 27/11526; H01L 27/11551; H01L 27/11556;
(Continued)

(56) References Cited

U.S. PATENT DOCUMENTS

| 7,800,163 B2 | 9/2010 | Izumi et al. |
| 7,910,432 B2 | 3/2011 | Tanaka et al. |

(Continued)

FOREIGN PATENT DOCUMENTS

| JP | 2011-204829 A | 10/2011 |
| KR | 10-2011-0102100 A | 9/2011 |

(Continued)

OTHER PUBLICATIONS

Korean Office action dated Oct. 14, 2019 for corresponding application, KR 10-2013-0135837.

*Primary Examiner* — Peter Bradford
(74) *Attorney, Agent, or Firm* — Lee IP Law, P.C.

(57) ABSTRACT

A semiconductor device includes a peripheral circuit region on a substrate, a polysilicon layer on the peripheral circuit region, a memory cell array region on the polysilicon layer and overlapping the peripheral circuit region, the peripheral circuit region being under the memory cell array region, an upper interconnection layer on the memory cell array region, and a vertical contact through the memory cell array region and the polysilicon layer, the vertical contact connecting the upper interconnection layer to the peripheral circuit region.

12 Claims, 22 Drawing Sheets

Related U.S. Application Data continuation of application No. 15/018,477, filed on Feb. 8, 2016, now Pat. No. 9,905,570, which is a continuation of application No. 14/534,352, filed on Nov. 6, 2014, now Pat. No. 9,431,415.

(51) Int. Cl.

| | | |
|---|---|---|
| *H01L 27/11573* | (2017.01) | |
| *H01L 27/11551* | (2017.01) | |
| *H01L 27/11556* | (2017.01) | |
| *H01L 29/66* | (2006.01) | |
| *H01L 29/788* | (2006.01) | |
| *H01L 29/792* | (2006.01) | |
| *H01L 27/11582* | (2017.01) | |
| *H01L 27/1157* | (2017.01) | |

(52) U.S. Cl.
CPC .. *H01L 27/11551* (2013.01); *H01L 27/11556* (2013.01); *H01L 27/11573* (2013.01); *H01L 27/11582* (2013.01); *H01L 29/66825* (2013.01); *H01L 29/66833* (2013.01); *H01L 29/7889* (2013.01); *H01L 29/7926* (2013.01)

(58) Field of Classification Search
CPC ......... H01L 27/11573; H01L 27/11582; H01L 29/04; H01L 29/16
See application file for complete search history.

(56) References Cited

U.S. PATENT DOCUMENTS

| | | | |
|---|---|---|---|
| 8,044,448 B2 | 10/2011 | Kamigaichi et al. | |
| 8,068,364 B2 | 11/2011 | Maejima | |
| 8,288,816 B2 | 10/2012 | Komori et al. | |
| 8,324,680 B2 | 12/2012 | Izumi et al. | |
| 8,338,882 B2 | 12/2012 | Tanaka et al. | |
| 8,374,033 B2 | 2/2013 | Kito et al. | |
| 2007/0252201 A1 | 11/2007 | Kito et al. | |
| 2008/0099819 A1* | 5/2008 | Kito | G11C 16/10 257/315 |
| 2008/0186771 A1* | 8/2008 | Katsumata | G11C 16/0483 365/185.17 |
| 2009/0278193 A1* | 11/2009 | Murata | H01L 27/11551 257/324 |
| 2010/0320526 A1 | 12/2010 | Kidoh et al. | |
| 2011/0169071 A1* | 7/2011 | Uenaka | H01L 27/105 257/326 |
| 2011/0220987 A1* | 9/2011 | Tanaka | H01L 27/11578 257/324 |
| 2011/0286275 A1 | 11/2011 | Jeon et al. | |
| 2011/0309432 A1 | 12/2011 | Ishihara et al. | |
| 2012/0182779 A1* | 7/2012 | Fukuda | G11C 5/02 365/63 |
| 2013/0017629 A1* | 1/2013 | Pyo | H01L 21/306 438/16 |
| 2015/0138862 A1 | 5/2015 | Park et al. | |
| 2015/0187814 A1* | 7/2015 | Miyairi | H01L 29/78606 257/43 |
| 2016/0293739 A1* | 10/2016 | Zhang | H01L 29/1033 |
| 2018/0308857 A1* | 10/2018 | Kim | H01L 27/1157 |

FOREIGN PATENT DOCUMENTS

| | | |
|---|---|---|
| KR | 10-2012-0075882 A | 7/2012 |
| KR | 10-2012-0083230 A | 7/2012 |
| KR | 10-2013-0019688 A | 2/2013 |

* cited by examiner

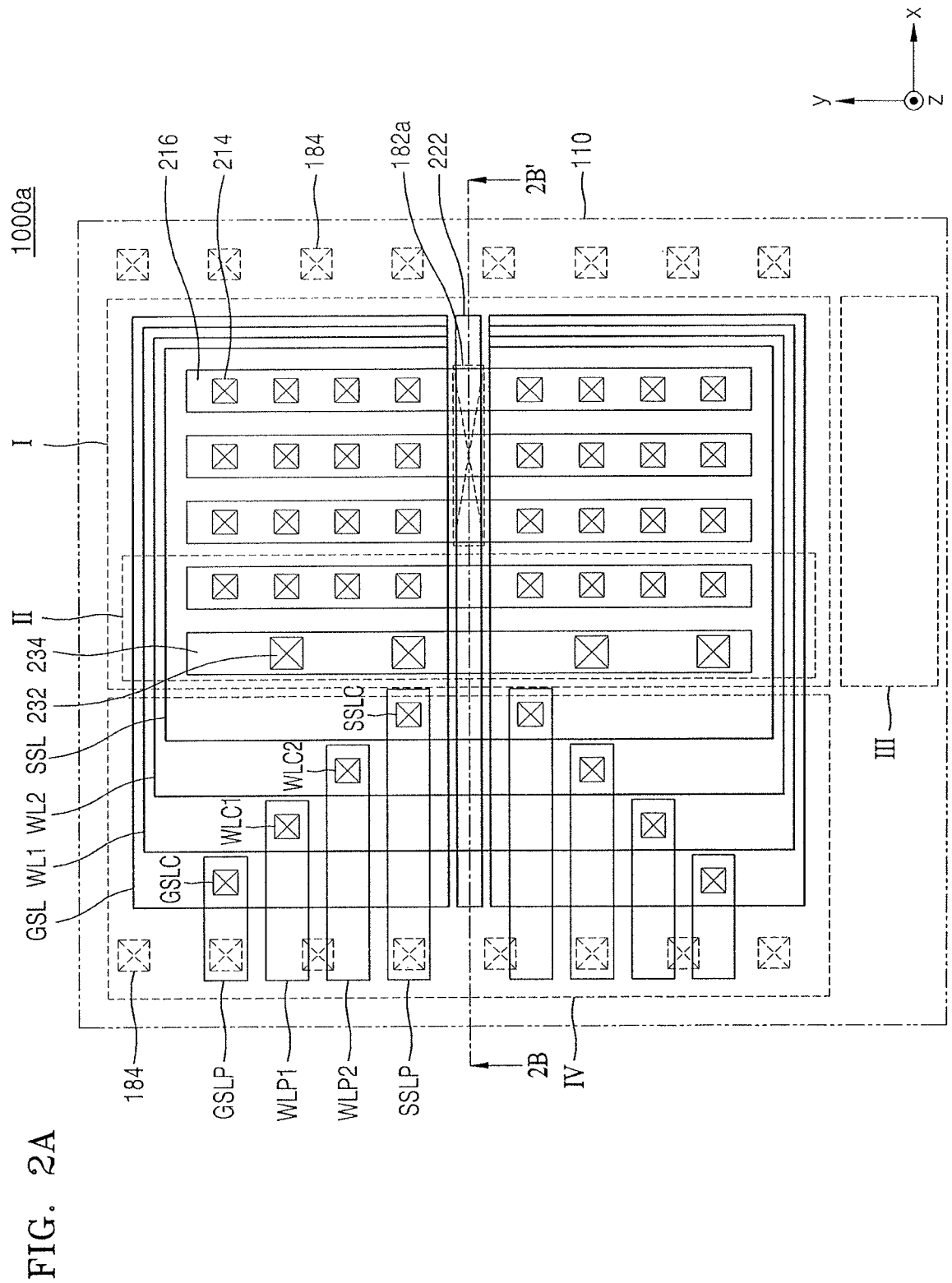

SEMICONDUCTOR DEVICE

CROSS-REFERENCE TO RELATED APPLICATIONS

This is a continuation application based on application Ser. No. 15/869,888, filed Jan. 12, 2018, which in turn is a continuation of application Ser. No. 15/018,477, filed Feb. 8, 2016, now U.S. Pat. No. 9,905,570, issued Feb. 27, 2018, which in turn is a continuation of application Ser. No. 14/534,352, filed Nov. 6, 2014, now U.S. Pat. No. 9,431,415, the entire contents of which is hereby incorporated by reference.

Korean Patent Application No. 10-2013-0135837, filed on Nov. 8, 2013, in the Korean Intellectual Property Office, and entitled: "Semiconductor Device," is incorporated by reference herein in its entirety.

BACKGROUND

1. Field

Embodiments relate to a semiconductor device, and more particularly, to a semiconductor device having a NAND cell array.

2. Description of the Related Art

As info-communication devices have had multiple functions recently, the capacity and the degree of integration of a memory device are increasing. A reduction in a memory cell size for increasing the degree of integration may complicate operation of circuits and/or of interconnect structures included in a memory device for operation and electrical connection of the memory device. Accordingly, there is a necessity for a memory device that has excellent electrical characteristics together with an improved degree of integration.

SUMMARY

Embodiments provide a semiconductor device having excellent electrical characteristics and a high degree of integration.

According to an aspect of embodiments, there is provided a semiconductor device including a peripheral circuit gate structure on a substrate, a first semiconductor layer on the peripheral circuit gate structure, a memory cell array region on the first semiconductor layer, a vertical contact through the memory cell array region and the first semiconductor layer, the vertical contact being electrically connected to the peripheral circuit gate structure, and a peripheral circuit interconnection structure including an upper interconnection layer on the memory cell array region, the peripheral circuit interconnection structure being electrically connected to the vertical contact.

In exemplary embodiments, the peripheral circuit gate structure may overlap the memory cell array region in a vertical direction.

In exemplary embodiments, the peripheral circuit interconnection structure may further include a dummy bit line formed at the same level as a bit line in the memory cell array region, and the vertical contact and the upper interconnection layer may be electrically connected to each other through the dummy bit line.

In exemplary embodiments, the peripheral circuit interconnection structure may further include a lower interconnection layer connected to the peripheral circuit gate structure under the memory cell array region, and the upper interconnection layer may include a material having a lower sheet resistance than a material of the lower interconnection layer.

In exemplary embodiments, the memory cell array region may include a channel layer extending in a vertical direction on the first semiconductor layer, and a ground selection line, word lines, and a string selection line spaced apart in the vertical direction along a sidewall of the channel layer.

In exemplary embodiments, the first semiconductor layer may include at least one common source region, and the at least one common source region may be electrically connected to the substrate through a first buried contact.

In exemplary embodiments, the at least one common source region may include a first impurity, and a concentration of the first impurity in the at least one common source region may increase in a vertical direction toward the substrate.

In exemplary embodiments, the first buried contact may extend in a direction in which the at least one common source region extends.

In exemplary embodiments, the first semiconductor layer may include at least one p+ well, and the at least one p+ well may be electrically connected to the substrate through a second buried contact.

In exemplary embodiments, the semiconductor device may further include a barrier metal layer formed between the first semiconductor layer and the peripheral circuit gate structure.

In exemplary embodiments, the memory cell array region may include a plurality of word lines on the first semiconductor layer and spaced apart from the first semiconductor layer, and a ground selection line and a string selection line which are formed on both sides of the plurality of word lines, respectively.

According to another aspect of embodiments, there is provided a semiconductor device including a peripheral circuit region on a substrate, a polysilicon layer on the peripheral circuit region, a memory cell array region on the polysilicon layer and overlapping the peripheral circuit region, the peripheral circuit region being under the memory cell array region, an upper interconnection layer on the memory cell array region, and a vertical contact through the memory cell array region and the polysilicon layer, the vertical contact connecting the upper interconnection layer to the peripheral circuit region.

In exemplary embodiments, the peripheral circuit region may include at least one peripheral circuit configured to process input or output data.

In exemplary embodiments, the at least one peripheral circuit may include a page buffer, a latch circuit, a cache circuit, a column decoder, a sense amplifier, or a data in/out circuit.

In exemplary embodiments, the upper interconnection layer may include copper, aluminum, silver, or gold.

According to yet another aspect of embodiments, there is provided a semiconductor device including a memory cell array region on a substrate, a peripheral circuit gate structure between the memory cell array region and the substrate, the memory cell array region and the peripheral circuit gate structure overlapping each other, a first semiconductor layer between the peripheral circuit gate structure and the memory cell array region, a vertical contact through the memory cell array region and through the first semiconductor layer, the vertical contact being electrically connected to the peripheral circuit gate structure, and a peripheral circuit interconnection structure on the memory cell array region, the peripheral circuit interconnection structure being electrically connected to the vertical contact.

The memory cell array region may be spaced apart from the peripheral circuit gate structure along a vertical direction, the memory cell array region completely overlapping the peripheral circuit gate structure.

The vertical contact may extend along the vertical direction through the memory cell array region and through the first semiconductor layer, the vertical contact electrically connecting the peripheral circuit interconnection structure and the peripheral circuit gate structure through the memory cell array region.

The first semiconductor layer may include at least one common source region electrically connected to the substrate through a first buried contact, the first buried contact overlapping the memory cell array region.

The first semiconductor layer may be spaced apart from the substrate along a vertical direction, the first buried contact extending along the vertical direction from the first semiconductor layer toward the substrate.

BRIEF DESCRIPTION OF THE DRAWINGS

Exemplary embodiments will be more clearly understood from the following detailed description taken in conjunction with the accompanying drawings, in which:

FIG. 2A illustrates a layout diagram of a semiconductor device according to exemplary embodiments;

DETAILED DESCRIPTION

Figure 1A:
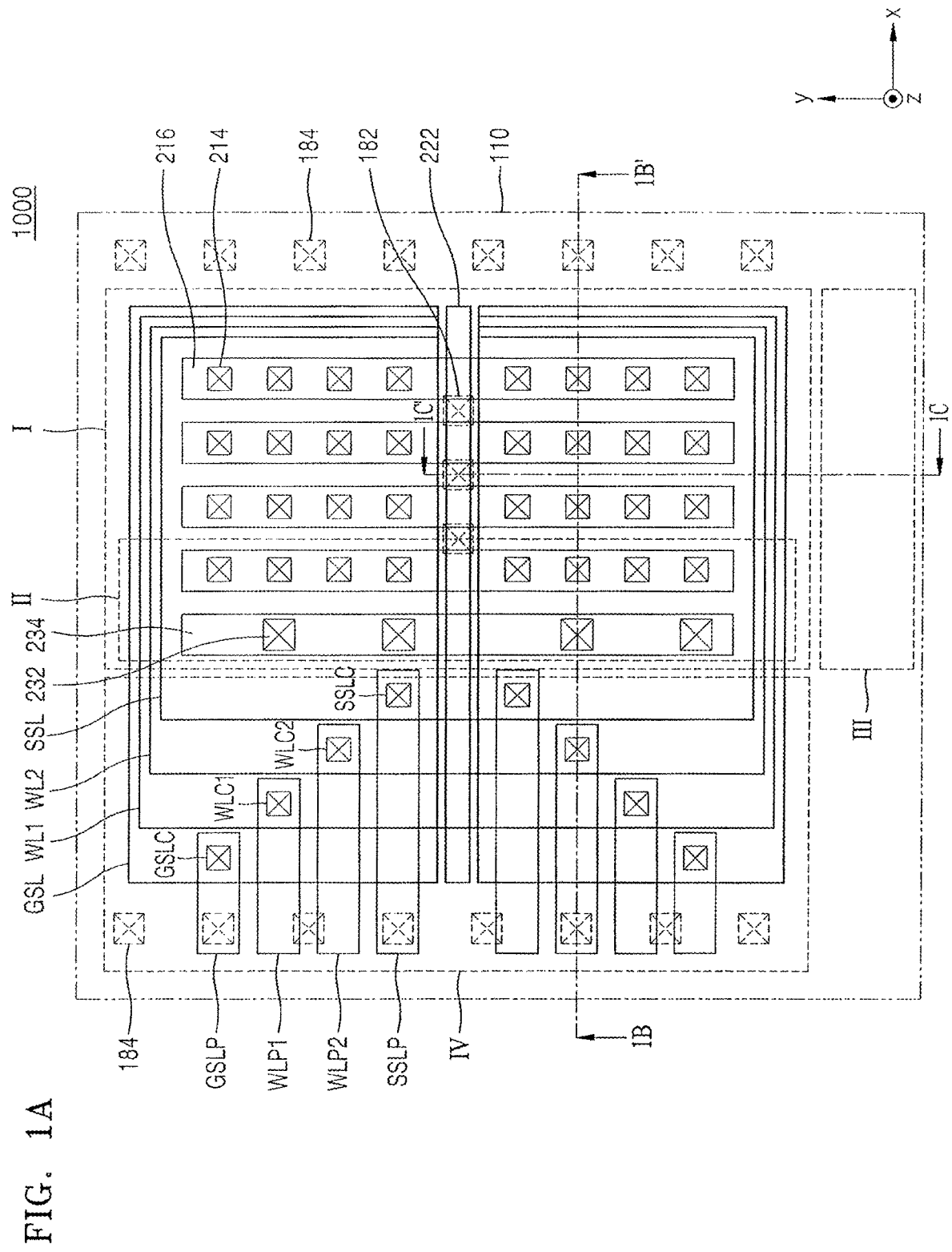
FIG. 1A illustrates a layout diagram of a semiconductor device according to exemplary embodiments.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer, i.e., element, is referred to as being "on" another layer or substrate, it can be directly on the other layer or substrate, or intervening layers may also be present. In addition, it will also be understood that when a layer is referred to as being "between" two layers, it can be the only layer between the two layers, or one or more intervening layers may also be present. Like reference numerals refer to like elements throughout.

As used herein, the term "and/or" includes any and all combinations of one or more of the associated listed items. Expressions such as "at least one of," when preceding a list of elements, modify the entire list of elements and do not modify the individual elements of the list.

Figure 1B:
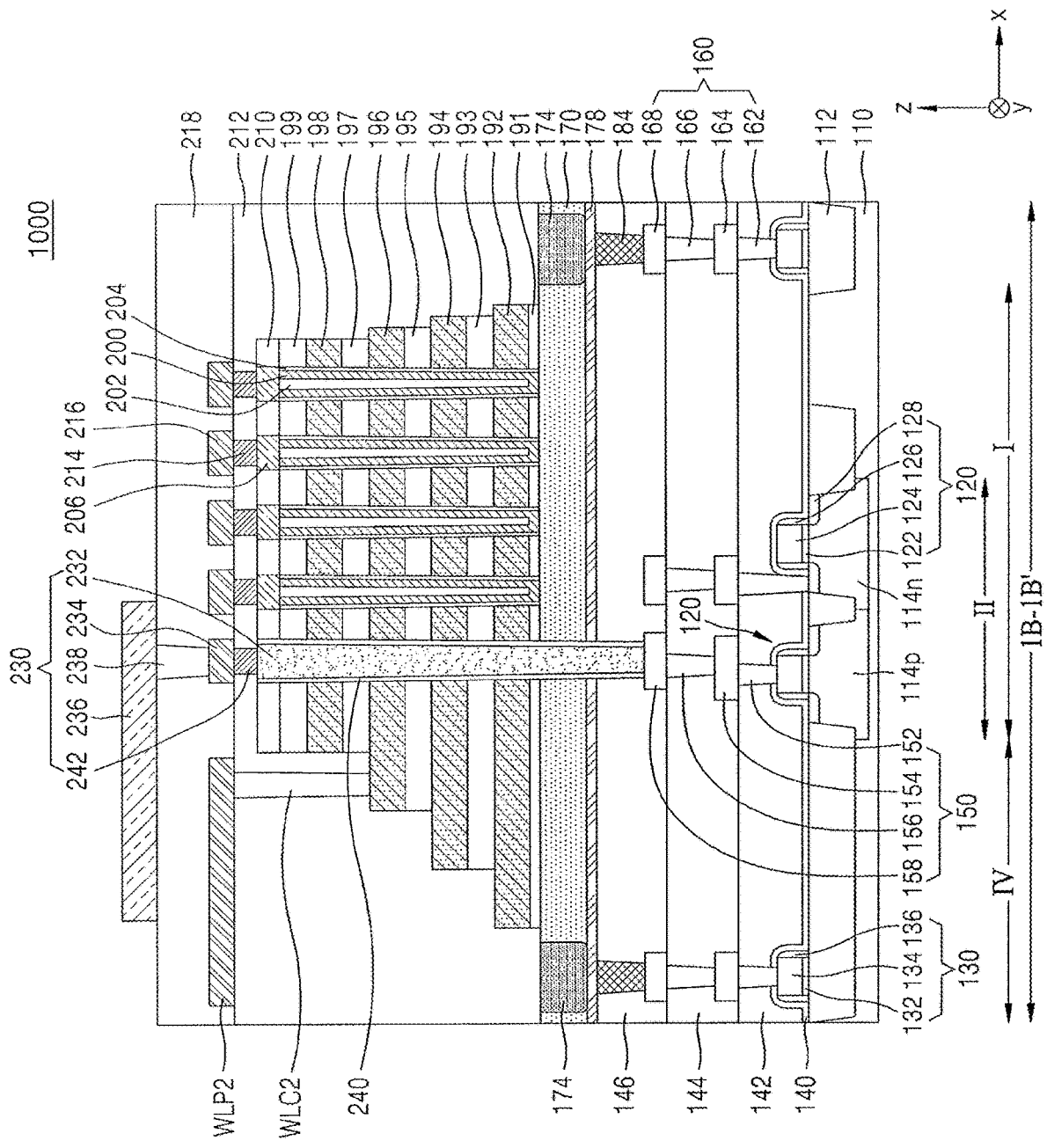
FIGS. 1B and 1C illustrate cross-sectional views along lines 1B-1B' and 1C-1C' of FIG. 1A, respectively.
Figure 1C:
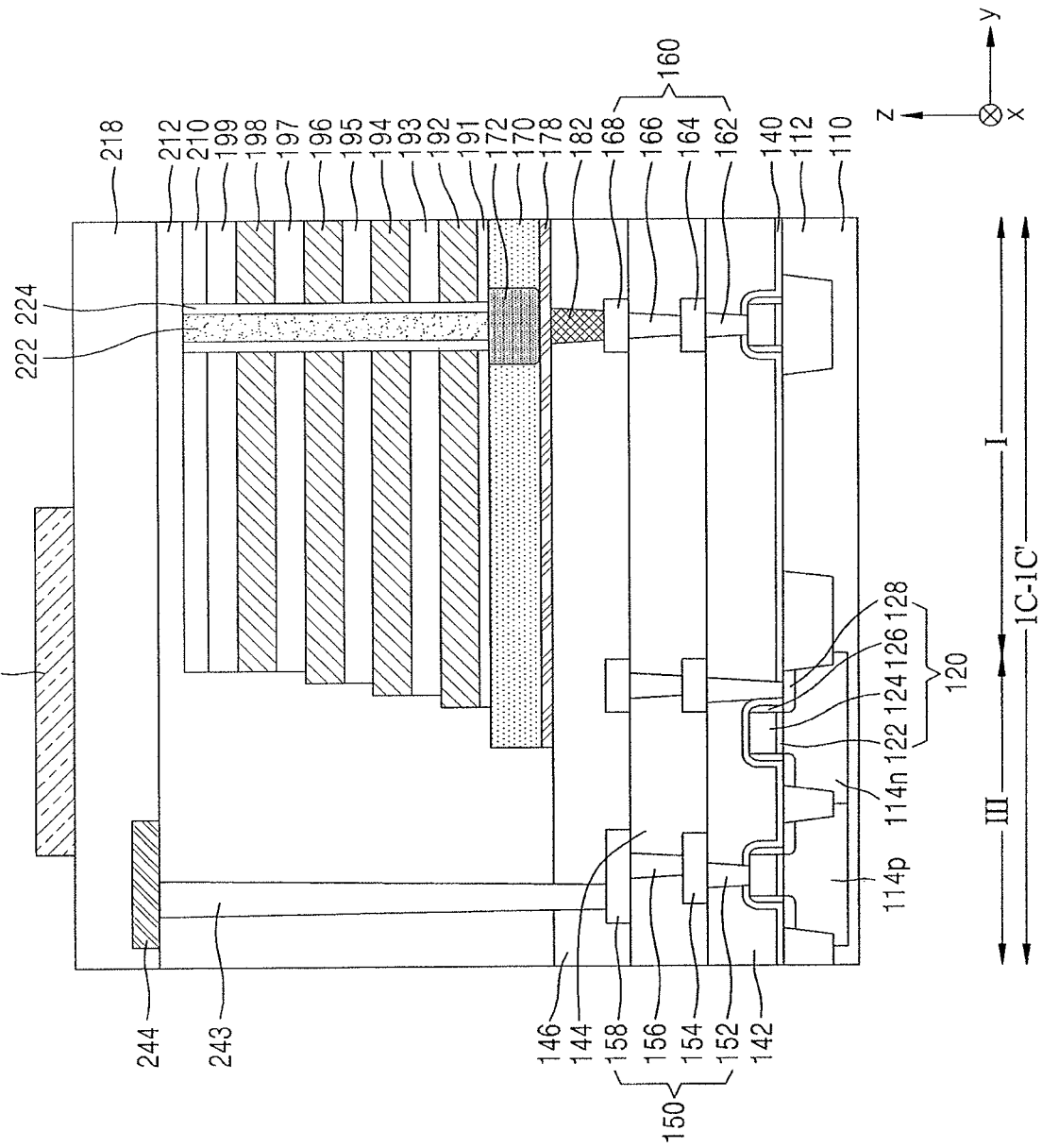

FIG. 1A illustrates a layout diagram of a semiconductor device 1000 according to exemplary embodiments, and FIGS. 1B and 1C illustrate cross-sectional views of the semiconductor device 1000. FIG. 1B illustrates a cross-sectional view taken along line 1B-1B' of FIG. 1A, and FIG. 1C illustrates a cross-sectional view taken along line 1C-1C' of FIG. 1A.

Referring to FIGS. 1A to 1C, a substrate 110 of the semiconductor device 1000 may include a memory cell array region I, a first peripheral circuit region II, a second peripheral circuit region III, and a bonding pad region IV.

In the memory cell array region I, vertical memory cells may be disposed. In the first and second peripheral, i.e., driving, circuit regions II and III, peripheral, i.e., driving, circuits for driving the vertical memory cells may be disposed.

The first peripheral circuit region II may be disposed under the memory cell array region I, and may overlap the memory cell array region I in a vertical direction. Peripheral circuits disposed in the first peripheral circuit region H may process data input to/output from the memory cell array region I at high speed. For example, the peripheral circuits may be page buffers, latch circuits, cache circuits, column decoders, sense amplifiers, data in/out circuits, or so on.

For example, the second peripheral circuit region III may be disposed at a first side of the memory cell array region I not to overlap the memory cell array region I and/or the first peripheral circuit region II. Peripheral circuits formed in the second peripheral circuit region III may be, e.g., row decoders. However, while FIG. 1A illustrates that the peripheral circuits are disposed in the second peripheral circuit region III not to overlap the memory cell array region I, the second peripheral circuit region III is not limited to the layout in FIG. 1A. In another example, the peripheral circuits disposed in the second peripheral circuit region III may be formed under the memory cell array region I according to a design.

The bonding pad region IV may be formed at a second side of the memory cell array region I. In the bonding pad region IV, interconnections connected to word lines of the respective vertical memory cells in the memory cell array region I may be formed.

In the first peripheral circuit region II of the substrate 110, an active region may be defined by a device isolation layer 112. In the active region, a peripheral circuit p-well 114$p$ and a peripheral circuit n-well 114$n$ may be formed. An n-channel metal oxide semiconductor (NMOS) transistor may be formed on the peripheral circuit p-well 114$p$, and a p-channel metal oxide semiconductor (PMOS) transistor may be formed on the peripheral circuit n-well 114$n$.

A peripheral circuit gate structure 120 may be formed on the active region of the substrate 110. The peripheral circuit gate structure 120 may include a peripheral circuit gate insulating layer 122, a peripheral circuit gate electrode 124, a peripheral circuit spacer 126, and source/drain regions 128.

A dummy gate structure 130 may be formed in a field region of the substrate 110, i.e., on the device isolation layer 112. The dummy gate structure 130 may be disposed to overlap the memory cell array region I or disposed along an outline of the memory cell array region I. The dummy gate structure 130 may include a dummy gate insulating layer 132, a dummy gate electrode 134, and a dummy spacer 136.

A first etch stop layer 140 may cover the peripheral circuit gate structure 120 and the dummy gate structure 130 on the substrate 110. The first etch stop layer 140 includes an insulating material, e.g., silicon oxide or silicon oxynitride, and may be formed with a predetermined thickness to, e.g., conformally, cover the peripheral circuit gate structure 120 and the dummy gate structure 130.

On the first etch stop layer 140, first to third interlayer insulating layers 142, 144, and 146 may be stacked in sequence. The first to third interlayer insulating layers 142, 144, and 146 may include, e.g., silicon oxide, silicon oxynitride, and so on.

A lower interconnection structure 150 is formed in the first to third interlayer insulating layers 142, 144, and 146, and may be connected to the peripheral circuit gate structure 120. The lower interconnection structure 150 may include a first interconnection contact 152, a first lower interconnection layer 154, a second interconnection contact 156, and a second lower interconnection layer 158. The first lower interconnection layer 154 may be formed on the first interlayer insulating layer 142, and is electrically connected to the peripheral circuit gate structure 120 through the first interconnection contact 152. The second lower interconnection layer 158 may be formed on the second interlayer insulating layer 144, and is electrically connected to the first lower interconnection layer 154 through the second interconnection contact 156. The first and second lower interconnection layers 154 and 158 may include a metal or a metal silicide material having a high melting point. In exemplary embodiments, the first and second lower interconnection layers 154 and 158 may include a metal, e.g., tungsten (W), molybdenum (Mo), titanium (Ti), cobalt (Co), tantalum (Ta), and/or nickel (Ni), or a conductive material, e.g., tungsten silicide, titanium silicide, cobalt silicide, tantalum silicide, and/or nickel silicide.

FIGS. 1B and 1C illustrate the lower interconnection structure 150 having a structure in which the two lower interconnection layers 154 and 158 are connected by the two interconnection contacts 152 and 156. However, embodiments are not limited thereto. For example, according to the layout of the first peripheral circuit region II and the type and arrangement of the peripheral circuit gate structure, the lower interconnection structure 150 may have a structure with three or more lower interconnection layers connected by three or more interconnection contacts.

A dummy interconnection structure 160 may be connected to the dummy gate structure 130 in the first to third interlayer insulating layers 142, 144, and 146. The dummy interconnection structure 160 may include a first dummy interconnection contact 162, a first dummy interconnection layer 164, a second dummy interconnection contact 166, and a second interconnection layer 168.

A first semiconductor layer 170 may be formed on the third interlayer insulating layer 146. The first semiconductor layer 170 may be formed to overlap the memory cell array region I and the bonding pad region IV, and may not be formed at least in a part of the second peripheral circuit region III. The first semiconductor layer 170 may serve as a substrate on which the vertical memory cells will be formed. In exemplary embodiments, the first semiconductor layer 170 may include, e.g., polysilicon doped with an impurity. For example, the first semiconductor layer 170 may include polysilicon doped with a p-type impurity. Also, the first semiconductor layer 170 may be formed with a height, e.g., thickness along the z-axis, of about 20 nm to about 500 nm, but the height of the first semiconductor layer 170 is not limited thereto.

In a portion of the first semiconductor layer 170 of the memory cell array region I, a common source region 172 extending in a first direction (an x direction in FIG. 1C), which is parallel to the main surface of the substrate 110, may be formed. The common source region 172 may be an impurity region doped with an n-type impurity at a high concentration, and a p-well (not shown) in the common source region 172 and the first semiconductor layer 170 may constitute a p-n junction diode. The common source region 172 may serve as a source region that supplies current to the vertical memory cells. The common source region 172 may have a concentration profile in which the doping concentration of the n-type impurity increases in a vertically downward direction from the upper surface of the first semiconductor layer 170.

In a portion of the first semiconductor layer 170 outside the memory cell array region I, e.g., in the pad region IV or in a peripheral portion illustrated on the right side of the cell array region I in FIG. 1A, a p+ well 174 may be formed. In the edge portion of the first semiconductor layer 170, a plurality of p+ wells 174 may be arranged at intervals in a second direction (a y direction in FIG. 1A), which is parallel to the main surface of the substrate 110. The p+ wells 174 may be impurity regions doped with a p-type impurity at a high concentration. The p+ wells 174 may supply current into the p-well formed in the first semiconductor layer 170 so that a memory cell array may have high response speed. The p+ wells 174 may have a concentration profile in which the doping concentration of the p-type impurity increases in a vertically downward direction from the upper surface of the first semiconductor layer 170.

Optionally, a barrier metal layer 178 may be interposed between the first semiconductor layer 170 and the third interlayer insulating layer 146. In exemplary embodiments, the barrier metal layer 178 may include, e.g., Ti, Ta, titanium nitride, tantalum nitride, or so on. The barrier metal layer 178 may form an ohmic contact with the first semiconductor layer 170, thereby reducing resistance between first and second buried contacts 182 and 184 formed under the barrier metal layer 178 and the first semiconductor layer 170. However, when the barrier metal layer 178 is unnecessary according to the kind of a metal material used as the first and second buried contacts 182 and 184 and the doping concentration of the first semiconductor layer 170, the barrier metal layer 178 may not be formed.

The first buried contact 182 may be formed under the common source region 172. That is, the first buried contact 182 may be formed between the common source region 172 and the dummy interconnection structure 160, e.g., between the barrier metal layer 178 and the dummy interconnection structure 160 along the z-axis (FIG. 1C). For example, as illustrated in FIG. 1A, a plurality first buried contacts 182 may be spaced apart from each other along the x-axis, e.g., along the common source region 172. Accordingly, the common source region 172 may be electrically connected to the dummy gate structure 130 through the first buried contact 182 and the dummy interconnection structure 160. The first buried contact 182 may include a metal, e.g., W, Mo, Ti, Co, Ta, and/or Ni, or a conductive material, e.g., tungsten silicide, titanium silicide, cobalt silicide, tantalum silicide, and/or nickel silicide.

Since the first buried contact 182 electrically connects the common source region 172 to the dummy gate structure 130 on the substrate 110, malfunction of vertical memory devices may be prevented or substantially minimized. That is, when an interconnection line connected to the common source region 172 is on an upper portion of a memory cell array, i.e., rather than being embedded under the common source region 172 as the first buried contact 182, an area for other interconnection lines on the upper portion of the memory cell array may be reduced due to a limited area of the upper portion of the memory cell array. Therefore, when the common source region 172 is connected to the dummy gate structure 130 on the substrate 110 through the first buried contact 182 according to example embodiments, i.e., through a contact embedded within a plurality of stacked insulation layers underneath the common source region 172, the first buried contacts 182 may be formed under the common source region 172 without limiting or minimizing an area employed for other interconnection lines in the upper portion of the memory cell array. Therefore, malfunction of the semiconductor device 1000 may be effectively prevented or substantially minimized.

The second buried contact 184 may be formed under the p+ well 174. That is, the second buried contact 184 may be formed between the p+ well 174 and the dummy interconnection structure 160, e.g., between the barrier metal layer 178 and the dummy interconnection structure 160 along the z-axis (FIG. 1B). For example, as illustrated in FIG. 1A, a plurality second buried contacts 184 may be spaced apart from each other along the y-axis, e.g., to overlap corresponding p+ wells 174 along the y-axis. Accordingly, the p+ well 174 may be electrically connected to the dummy gate structure 130 through the second buried contact 184 and the dummy interconnection structure 160 along the z-axis. Since the p+ well 174 is electrically connected to the dummy gate structure 130 on the substrate 110, malfunction of the vertical memory devices may be prevented or substantially minimized.

On the first semiconductor layer 170, a first insulating layer 191, a ground selection line 192, a second insulating layer 193, a first word line 194, a third insulating layer 195, a second word line 196, a fourth insulating layer 197, a string selection line 198, and a fifth insulating layer 199 may be formed in sequence.

In exemplary embodiments, the ground selection line 192, the word lines 194 and 196, and the string selection line 198 may include, e.g., a metal, e.g., W, Ni, Co, and/or Ta, a polysilicon doped with an impurity, a metal silicide, e.g., tungsten silicide, titanium silicide, cobalt silicide, tantalum silicide, and/or nickel silicide, or a combination thereof. The first to fifth insulating layers 191, 193, 195, 197, and 199 may include, e.g., silicon oxide, silicon nitride, silicon oxynitride, and so on.

FIGS. 1A to 1C illustrate that only two word lines 194 and 196 are formed, but embodiments are not limited thereto. For example, a structure may be formed in which a plurality, e.g., 4, 8, 16, 32, or 64, of word lines are stacked in a vertical direction between the ground selection line 192 and the string selection line 198, and an insulating layer is interposed between every two adjacent word lines. The number of stacked word lines is not limited to the above numbers. Also, in the structure, two or more ground selection lines 192 and two or more string selection lines 198 may be stacked in a vertical direction.

Although not shown in the drawings, at least one dummy word line (not shown) may be formed between the ground selection line 192 and the first word line 194, and/or between the second word line 196 and the string selection line 198. The dummy word line may prevent inter-cell interference that may occur between the lowermost word line 194 and the ground selection line 192, and/or between the uppermost word line 196 and the string selection line 198, when a distance between memory cells (i.e., the distance between the lines) is reduced in a vertical direction.

Channel layers 200 may penetrate through the ground selection line 192, the word lines 194 and 196, the string selection line 198, and the first to fifth insulating layers 191, 193, 195, 197, and 199, and may extend in a third direction (a z direction in FIG. 1B), which is perpendicular to the upper surface of the substrate 110. Bottom surfaces of the channel layers 200 may, e.g., directly, contact an upper surface of the first semiconductor layer 170. The channel layers 200 may be arranged at predetermined intervals in the first and second directions, i.e., along the x and y axes.

In exemplary embodiments, the channel layers 200 may include, e.g., polysilicon doped with an impurity or undoped polysilicon. The channel layers 200 may be formed in the shape of vertically extending cups, e.g., cylinders with blocked bottoms, and interiors of the channel layers 200 may be filled with buried insulating layers 202. For example, upper surfaces of the buried insulating layers 202 may be placed at a same level as upper surfaces of the channel layers 200. In another example, the channel layers 200 may be formed in a pillar shape, so the buried insulating layers 202 may not be formed.

A gate insulating layer 204 may be interposed between each of the channel layers 200 and each of the ground selection line 192, the word lines 194 and 196, and the string selection line 198. Each gate insulating layer 204 may include a tunnel insulating film (see 204a in FIG. 8), a charge storage film (see 204b in FIG. 8), and a blocking insulating film (see 204c in FIG. 8) that are stacked in sequence. Optionally, a barrier metal layer (not shown) may be further formed between each gate insulating layer 204 and each of the ground selection line 192, the word lines 194 and 196, and the string selection line 198. The tunnel insulating film 204a may include, e.g., silicon oxide, hafnium oxide, aluminum oxide, zirconium oxide, tantalum oxide, and so on. The charge storage film 204b may be a region in which electrons tunneling from the channel layer 200 are stored, and may include, e.g., silicon nitride, boron nitride, silicon-boron nitride, and/or polysilicon doped with an impurity. The blocking insulating film 204c may include a singular film or stacked films formed of, e.g., silicon oxide, silicon nitride, hafnium oxide, aluminum oxide, zirconium oxide, tantalum oxide, and so on. However, the material of the blocking insulating film 204c is not limited thereto, e.g., may include dielectric materials having high dielectric constants.

The ground selection line 192 and a portion of each channel layer 200 and a portion of each gate insulating layer 204 adjacent to the ground selection line 192 may constitute a ground selection transistor together. Also, the word lines 194 and 196 and a portion of each channel layer 200 and a portion of each gate insulating layer 204 adjacent to the word lines 194 and 196 may constitute a memory cell transistor together. Each string selection line 198 and a portion of each channel layer 200 and a portion of each gate insulating layer 204 adjacent to the string selection line 198 may constitute a string selection transistor together.

Drain regions 206 may be formed on the channel layers 200 and the buried insulating layers 202. In exemplary embodiments, the drain regions 206 may include polysilicon doped with an impurity.

A second etch stop layer 210 may be faulted on the fifth insulating layer 199 and the sidewalls of the drain regions 206. An upper surface of the second etch stop layer 210 may be formed at a same level as upper surfaces of the drain regions 206. The second etch stop layer 210 may include an insulating material, e.g., silicon nitride and silicon oxide.

A fourth interlayer insulating layer 212 may be formed on the second etch stop layer 210. The fourth interlayer insulating layer 212 may cover exposed side surfaces of the string selection line 198, the word lines 194 and 196, and the ground selection line 192.

Bit line contacts 214 may be formed to penetrate the fourth interlayer insulating layer 212 and may be connected to the drain regions 206. The fourth interlayer insulating layer 212 may have an upper surface formed at a same level as an upper surface of the bit line contacts 214. Bit lines 216 may be formed on the bit line contacts 214. The bit lines 216 may extend in the second direction, and the plurality of channel layers 200 arranged in the second direction may be electrically connected to the bit lines 216. A fifth interlayer insulating layer 218 that covers the bit lines 216 may be formed on the fourth interlayer insulating layer 212.

As illustrated in FIGS. 1A and 1C, a common source line 222 extending in the first direction, i.e., along the x-axis, may be formed on, e.g., directly on, the common source region 172. For example, as illustrated in FIG. 1C, the common source line 222 may penetrate through the ground selection line 192, the word lines 194 and 196, and the string selection line 198 to contact the common source region 172. Common source line spacers 224 including an insulating material may be formed on sidewalls of the common source line 222, thereby preventing electrical connection between the common source line 222 and each of the ground selection line 192, the word lines 194 and 196, and the string selection line 198. An upper surface of the common source line 222 may be formed at a same level as the upper surface of the second etch stop layer 210.

A peripheral circuit interconnection structure 230 may include a vertical contact 232, a dummy bit line 234, an upper interconnection layer 236, a third interconnection contact 238, and a dummy bit line contact 242. The peripheral circuit interconnection structure 230 may be disposed in the memory cell array region I, and may penetrate the ground selection line 192, the word lines 194 and 196, the string selection line 198, and the first semiconductor layer 170 to be electrically connected to the peripheral circuit gate structure 120.

The vertical contact 232 may penetrate the fourth interlayer insulating layer 212, the second etch stop layer 210, the string selection line 198, the word lines 194 and 196, the ground selection line 192, the first semiconductor layer 170, and the barrier metal layer 178 to be electrically connected to the lower interconnection structure 150. The bottom surface of the vertical contact 232 may contact the upper surface of the second lower interconnection layer 158. In exemplary embodiments, the vertical contact 232 may include a conductive material, e.g., W, Ni, Ta, Co, aluminum (Al), copper (Cu), tungsten silicide, nickel silicide, tantalum silicide, cobalt silicide, and/or polysilicon doped with an impurity. The horizontal cross section of the vertical contact 232 may be in a shape of a circle, an ellipse, a rectangle, or a square, but is not limited thereto.

A vertical contact spacer 240 including an insulating material may be formed on the sidewall of the vertical contact 232, thereby preventing electrical connection between the vertical contact 232 and each of the string selection line 198, the word lines 194 and 196, the ground selection line 192, and the first semiconductor layer 170.

The dummy bit line contact 242 may be formed on the vertical contact 232. The dummy bit line contact 242 may be formed at a same level as the bit line contacts 214.

The dummy bit line 234 may be formed on the dummy bit line contact 242 and the fourth interlayer insulating layer 212. The dummy bit line 234 may be formed to extend in the y direction at a predetermined distance from a bit line 216. An upper surface of the dummy bit line 234 may be formed at a same level as upper surfaces of the bit lines 216. Under the dummy bit line 234, the channel layers 200 may not be arranged. The dummy bit line 234 may be formed in a portion of the memory cell array region I in which the first peripheral circuit region II is formed, so the dummy bit line 234 provides an electrical connection function between the peripheral circuit gate structure 120 and the upper interconnection layer 236.

The upper interconnection layer 236 may be formed on the fifth interlayer insulating layer 218, and may be connected to the dummy bit line 234 through the third interconnection contact 238. In exemplary embodiments, the upper interconnection layer 236 may include a conductive material having a low sheet resistance. Also, the upper interconnection layer 236 may have a lower sheet resistance than the first and second lower interconnection layers 154 and 158. The upper interconnection layer 236 may include a metal, e.g., Al, Cu, silver (Ag), and/or gold (Au). The sheet resistance of the upper interconnection layer 236 may be, e.g., about 1.0 μΩcm to about 5.0 μΩcm.

When the upper interconnection layer 236 includes a material having a low sheet resistance, it is possible to reduce a resistance between the peripheral circuit gate structure 120 in the first peripheral circuit region II and the memory cells in the memory cell array region I, thereby preventing, e.g., a response speed delay, from occurring during integration of the memory cells. Also, since the upper interconnection layer 236 is electrically connected to the peripheral circuit gate structure 120 through the vertical contact 232 penetrating the memory cell array region I, a distance between the upper interconnection layer 236 and the peripheral circuit gate structure 120 may be minimized. Therefore, it is possible to reduce interconnection resistance between the peripheral circuit gate structure 120 and the memory cells, thereby preventing a reduction in cell current so that electrical characteristics of the semiconductor device 1000 may be improved. Also, since the memory cell array region I and the first peripheral circuit region II are arranged to overlap in a vertical direction in the substrate 110, the area of the cell array region I formed in the substrate 110 may be efficiently increased, and the degree of integration of the semiconductor device 1000 may be improved.

In addition, since interconnection lines connected from the common source region 172 and the p+ well 174 through the first and second buried contacts 182 and 184 are disposed under the memory cell array region I, the interconnection lines may not be formed on, e.g., the upper portion of, the memory cell array region I, and it is possible to ensure the area in which the upper interconnection layer 236 may be formed. Consequently, electrical characteristics of the semiconductor device 1000 may be improved.

In the second peripheral circuit region III of the substrate 110, the peripheral circuit gate structure 120 may be formed. The lower interconnection structure 150 penetrating the first etch stop layer 140 and the first to third interlayer insulating layers 142, 144, and 146 may be formed on the peripheral circuit gate structure 120. A fourth interconnection contact 243 may penetrate the fourth interlayer insulating layer 212 to be connected to the lower interconnection structure 150. On the fourth interconnection contact 243 and the fourth interlayer insulating layer 212, a peripheral circuit interconnection 244 may be formed. The peripheral circuit gate structure 120 formed in the second peripheral circuit region III may provide an electrical signal to the memory cells through the fourth interconnection contact 243 and the peripheral circuit interconnection 244 formed outside the memory cell array region I. In the peripheral circuit gate structure 120 formed in the second peripheral circuit region III shown in FIG. 1C, a channel region between the source/drain regions 128 is shown to be formed in the second direction for convenience. Unlike in FIG. 1C, however, the channel region may be formed in the first direction.

Referring to FIG. 1A, in the fourth interlayer insulating layer 212 of the bonding pad region IV, ground selection line contacts GSLC, first and second word line contacts WLC1 and WLC2, and string selection line contacts SSLC may be disposed. The ground selection line contacts GSLC, the first and second word line contacts WLC1 and WLC2, and the string selection line contacts SSLC may penetrate the second etch stop layer 210 to be connected to the ground selection line 192, the first and second word lines 194 and 196, and the string selection line 198, respectively. For example, as illustrated in FIG. 1B, the second word line contact WLC2 may penetrate through the fourth interlayer insulating layer 212 to contact the second word line 196. Upper surfaces of the ground selection line contacts GSLC, the first and second word line contacts WLC1 and WLC2, and the string selection line contacts SSLC may be formed at a same level, e.g., at a same level as an upper surface of the fourth interlayer insulating layer 212.

Ground selection line pads GSLP, word line pads WLP1 and WLP2, and string selection line pads SSLP that are electrically in contact with the ground selection line contacts GSLC, the first and second word line contacts WLC1 and WLC2, and the string selection line contacts SSLC, respectively, may be formed on the fourth interlayer insulating layer 212. Although not shown in the drawings, the ground selection line pads GSLP, the word line pads WLP1 and WLP2, and the string selection line pads SSLP may be electrically connected to a peripheral circuit through an upper interconnection (not shown).

Figure 2B:
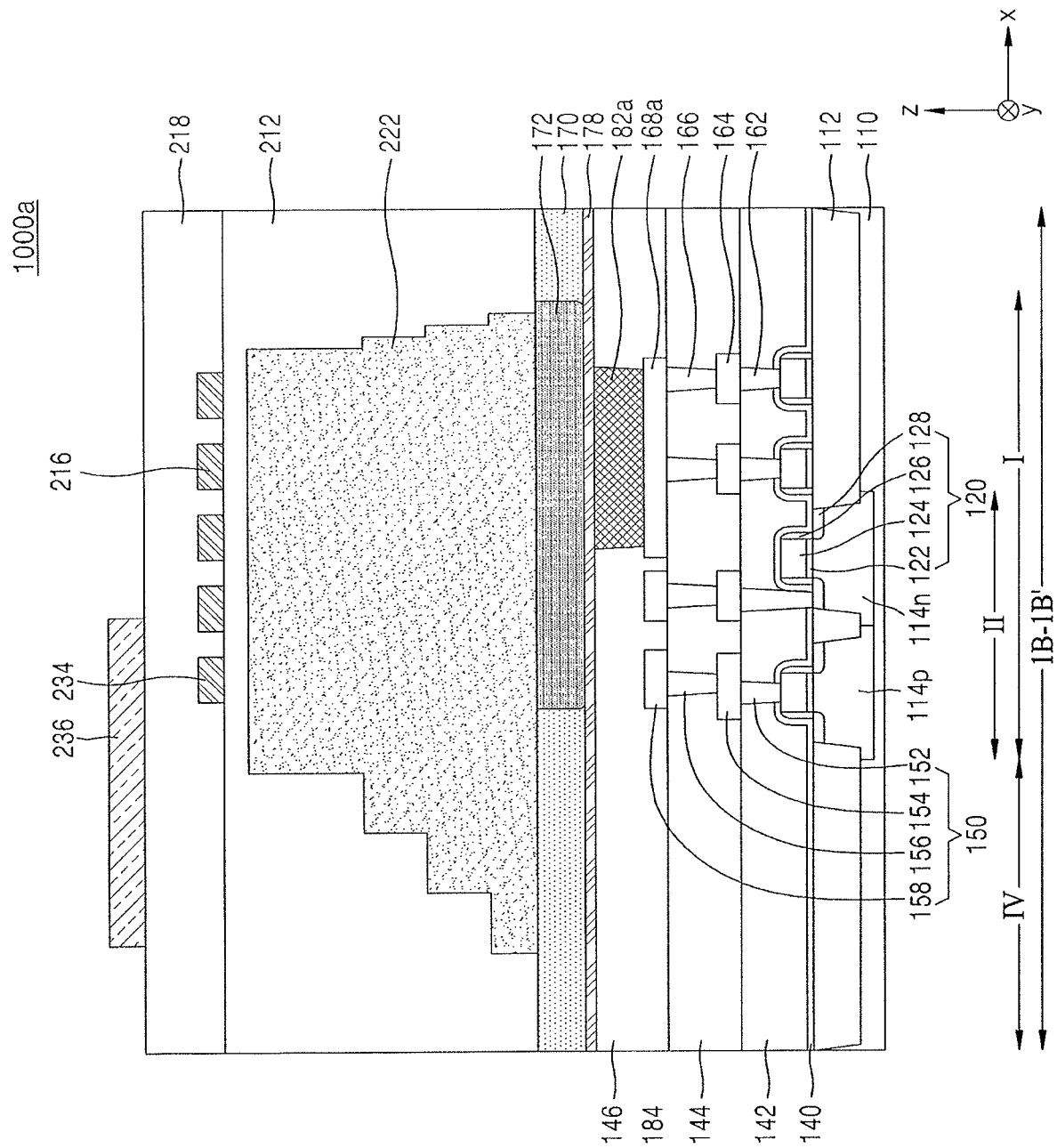
FIG. 2B illustrates a cross-sectional view taken along line 2B-2B' of FIG. 2A.

FIG. 2A illustrates a layout diagram of a semiconductor device 1000a according to exemplary embodiments, and FIG. 2B illustrates a cross-sectional view taken along line 2B-2B' of FIG. 2A. The semiconductor device 1000a in accordance with FIGS. 2A and 2B is similar to the semiconductor device 1000 described with reference to FIGS. 1A to 1C, except for a shape of a first buried contact 182a. Thus, the following description will focus on differences between FIGS. 1A-1C and FIGS. 2A-2B. In FIGS. 2A and 2B, same reference numerals as in FIGS. 1A to 1C are used to denote the same components.

Referring to FIGS. 2A and 2B, the first buried contact 182a may extend in a first direction, i.e., in the x direction in FIGS. 2A-2B, under the common source region 172 (FIG. 2B). The first buried contact 182a may be between the common source region 172 and the dummy interconnection structure 160 along the z direction of FIG. 2B.

The common source region 172 on the first buried contact 182a may be formed under a common source line 222 in the memory cell array region I. Here, the first buried contact 182a may be formed in the shape of an extended line in a portion of a region under the common source region 172 that does not overlap the first peripheral circuit region II. For example, as illustrated in FIG. 2B, the buried contact 182a may extend continuously in the x-axis in the memory cell array region I and outside the first peripheral circuit region II to overlap a portion of the common source region 172, e.g., the buried contact 182a and the first peripheral circuit region II may have a non-overlapping relationship. Also, a second lower interconnection layer 168a may be formed to extend in the first direction, so that n upper surface of the second lower interconnection layer 168a may contact the first buried contact 182a. A plurality of dummy gate structures 120 may be electrically connected to a lower portion of the first buried contact 182a.

Figure 3A:
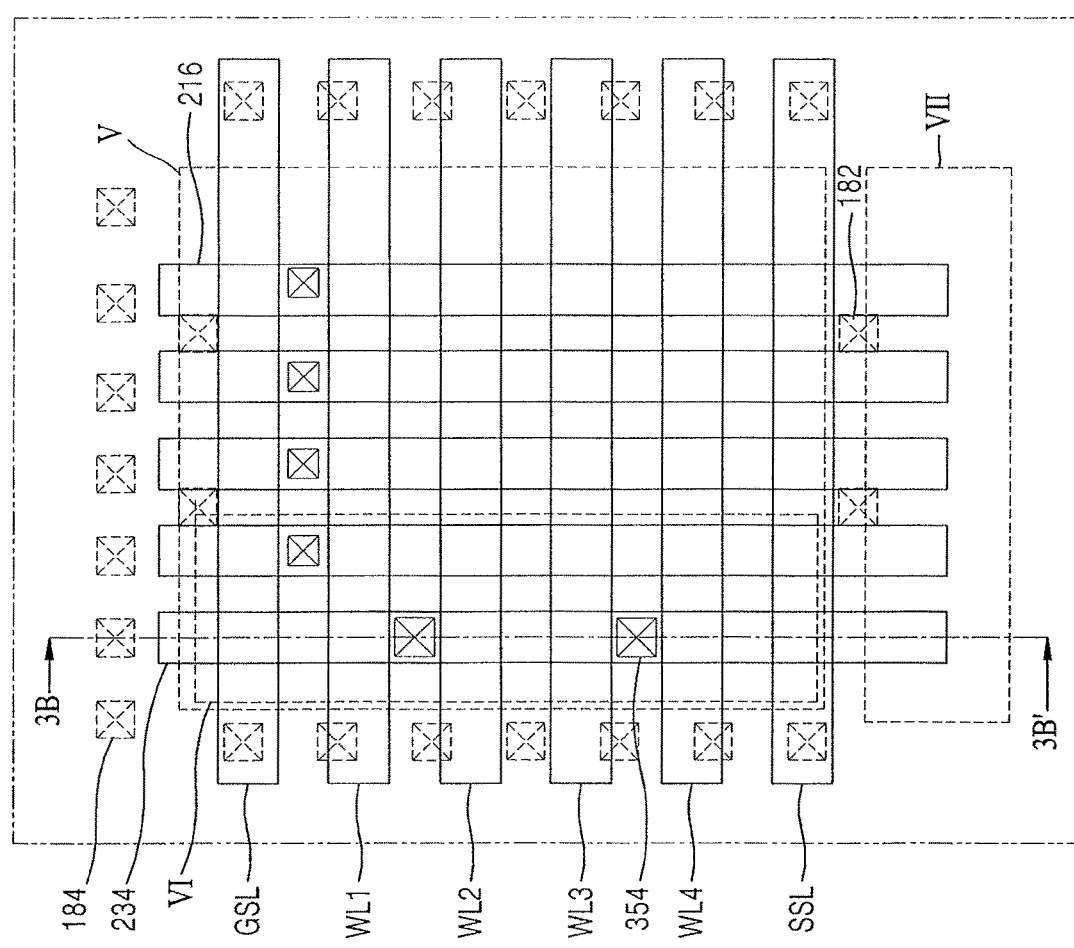
FIG. 3A illustrates a layout diagram of a semiconductor device according to exemplary embodiments.
Figure 3B:
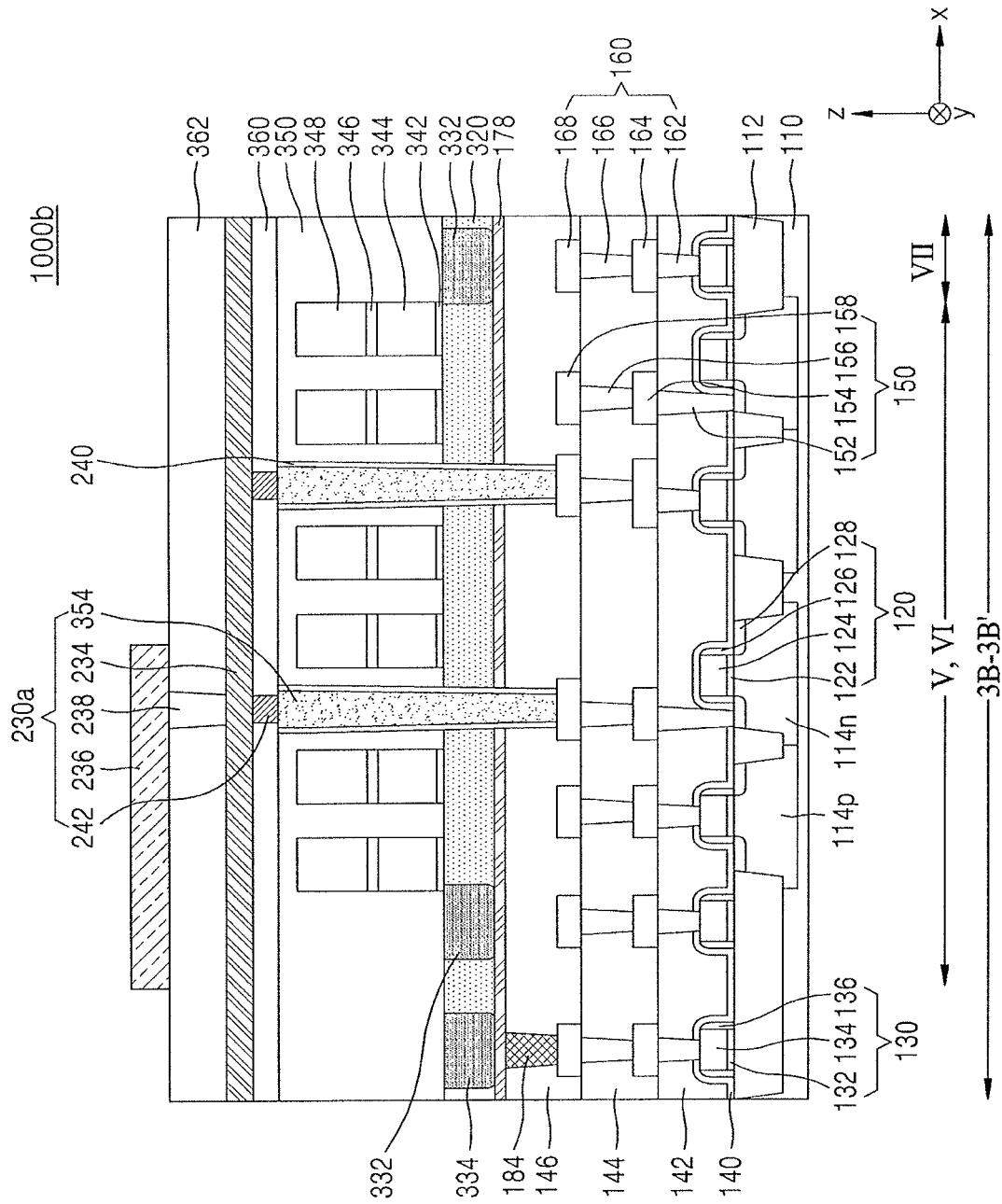
FIG. 3B illustrates a cross-sectional view taken along line 3B-3B' of FIG. 3A.

FIG. 3A illustrates a layout diagram of a semiconductor device 1000b according to exemplary embodiments, and FIG. 3B illustrates a cross-sectional view taken along line 3B-3B' of FIG. 3A. The semiconductor device 1000b is similar to the semiconductor device 1000 described with reference to FIGS. 1A to 1C, except that the semiconductor device 1000b is a non-volatile flat-panel memory device. Thus, the following description will focus on differences between FIGS. 1A-1C and FIGS. 3A-3B. In FIGS. 3A and 3B, same reference numerals as in FIGS. 1A to 1C are used to denote the same components.

Referring to FIGS. 3A and 3B, the substrate 110 may include a memory cell array region V, a first peripheral circuit region VI, and a second peripheral circuit region VII. In the memory cell array region V, non-volatile flat-panel memory cells may be disposed.

A plurality of device isolation trenches (not shown) extending in a second direction may be formed on a first semiconductor layer 320 with intervals therebetween in a first direction, so that an active region may be defined in the first semiconductor layer 320. A common source region 332 extending in the second direction, i.e., along the y-axis, may be formed in the first semiconductor layer 320, and p+ wells 334 may be formed at intervals outside the first semiconductor layer 320.

On the first semiconductor layer 320, a plurality of tunnel insulating film patterns 342 may be arranged in the first and second directions. On the plurality of tunnel insulating film patterns 342, a plurality of charge storage film patterns 344 may be formed. Accordingly, the plurality of charge storage film patterns 344 may also be disposed at intervals in the first and second directions. A plurality of blocking insulating films 346 extending in the first direction may be formed at intervals in the second direction on the plurality of tunnel insulating film patterns 342.

A plurality of gate electrodes 348 may be formed on the plurality of tunnel insulating film patterns 342. The plurality of gate electrodes 348 may extend in the first direction and may be spaced apart in the second direction. The plurality of gate electrodes 348 sequentially arranged in the second direction may include a ground selection line GSL, first to fourth word lines WL1, WL2, WL3, and WL4, and a string selection line SSL.

On the first semiconductor layer 320, a first insulating layer 350 covering the plurality of gate electrodes 348 may be formed. Meanwhile, although not shown in the drawings, air-gaps may be formed in the first insulating layer 350 between adjacent gate electrodes 348.

A peripheral circuit interconnection structure 230a may include a vertical contact 354, a dummy bit line 234, an upper interconnection layer 236, a third interconnection contact 238, and a dummy bit line contact 242. The vertical contact 354 may penetrate the first insulating layer 350, the first semiconductor layer 320, a barrier metal layer 178, and a third interlayer insulating layer 146 between the first and second word lines WL1 and WL2 to be connected to a lower interconnection structure 150.

A second insulating layer 360 may be formed on the first insulating layer 350 and the vertical contact 354, and a dummy bit line contact 242 connected to the vertical contact 354 may be formed in the second insulating layer 360. The dummy bit line 234 and the bit lines 216 may be formed on the second insulating layer 360, and a third insulating layer 362 covering the dummy bit line 234 and the bit lines 216 may be formed on the second insulating layer 360. The upper interconnection layer 236 formed on the third insulating layer 362 may be connected to the dummy bit line 234 through the third interconnection contact 238.

FIGS. 4A to 13 illustrate cross-sectional views of stages in a method of fabricating the semiconductor device 1000 according to exemplary embodiments. The fabrication method may be a method of fabricating the semiconductor device 1000 described with reference to FIGS. 1A to 1C. In particular, FIGS. 4A, 5A, 6A, 7, 8, 9A, 10, 11A, 12A, and 13 illustrate cross-sectional views taken along line 1B-1B' of FIG. 1A, and FIGS. 4B, 5B, 6B, 9B, 11B, and 12B are cross-sectional view taken along line 1C-1C' of FIG. 1A. In the peripheral circuit gate structure 120 shown in FIGS. 4B, 5B, 6B, 9B, 11B, and 12B, the channel region between the source/drain regions 128 is formed in the second direction (a y direction in FIG. 4B) for convenience, but the channel region may be formed in the first direction.

Figure 4A:
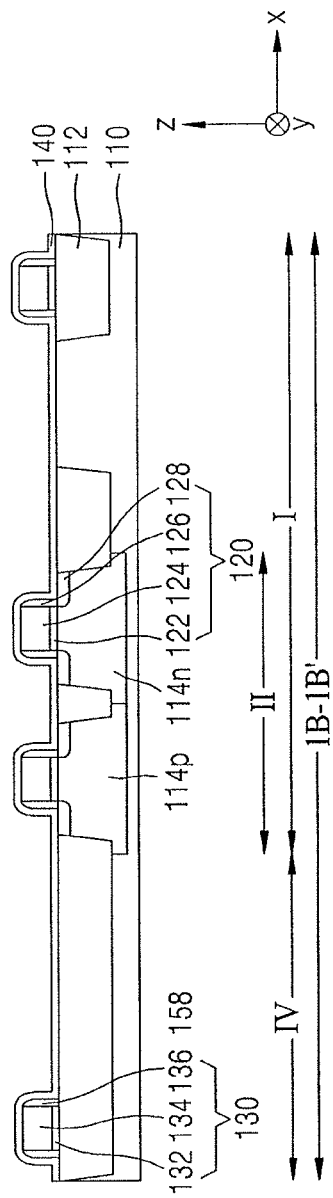
FIG. 4A to FIG. 13 illustrate cross-sectional views of stages in a method of fabricating a semiconductor device according to exemplary embodiments.
Figure 4B:
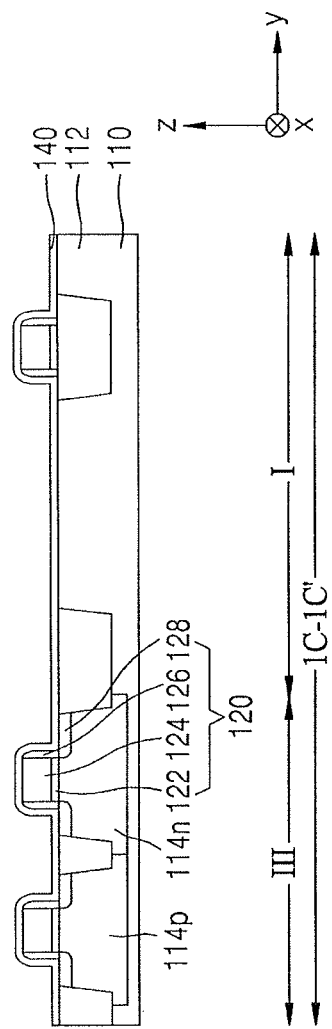

Referring to FIGS. 4A and 4B, after a buffer oxide layer (not shown) and a silicon nitride layer (not shown) are formed on the substrate 110, buffer oxide layer patterns (not shown), silicon nitride layer patterns (not shown), and a trench (not shown) may be formed by consecutively patterning the silicon nitride layer, the buffer oxide layer, and the substrate 110. By filling the trench with an insulating material, e.g., silicon oxide, the device isolation layer 112 may be formed. After the device isolation layer 112 is planarized until upper surfaces of the silicon nitride layer patterns are exposed, the silicon nitride layer patterns and the buffer oxide layer patterns may be removed.

A sacrificial oxide layer (not shown) is formed on the substrate and then patterned by using photoresist, and a first ion implantation process is performed so that the peripheral circuit p-well 114p may be formed in the substrate 110. Also, patterning is performed by using photoresist, and a second ion implantation process is performed so that the peripheral circuit n-well 114n may be formed in the substrate 110. The peripheral circuit p-well 114p may be an NMOS transistor-forming region, and the peripheral circuit n-well 114n may be a PMOS transistor-forming region.

The peripheral circuit gate insulating layer 122 may be formed on the substrate 110. The peripheral circuit gate insulating layer 122 may be formed to include a first gate insulating layer (not shown) and a second gate insulating layer (not shown) that are stacked in sequence. The first and second gate insulating layers may be a low-voltage gate insulating layer and a high-voltage gate insulating layer, respectively.

A peripheral circuit gate conductive layer (not shown) may be formed on the peripheral circuit gate insulating layer 122, and the peripheral circuit gate electrode 124 may be formed by patterning the peripheral circuit gate conductive layer. The peripheral circuit gate electrode 124 may be formed of doped polysilicon. Also, the peripheral circuit gate electrode 124 may be formed to have a multilayer structure including a polysilicon layer and a metal layer or a multilayer structure including a polysilicon layer and a metal silicide layer.

The peripheral circuit spacers 126 may be formed on the sidewalls of the peripheral circuit gate electrode 124. For example, by forming a silicon nitride layer on the peripheral circuit gate electrode 124 and then anisotropically etching the silicon nitride layer, the peripheral circuit spacer 126 may be formed. The source/drain regions 128 may be formed in portions of the substrate 110 on both sides of the peripheral circuit gate electrode 124. In the case of an NMOS transistor, the source/drain regions 128 may be doped with an n-type impurity, and in the case of a PMOS transistor, the source/drain regions 128 may be doped with a p-type impurity. The source/drain regions 128 may have a lightly doped drain (LDD) structure.

Accordingly, the peripheral circuit gate structure 120 including the peripheral circuit gate insulating layer 122, the peripheral circuit gate electrode 124, the peripheral circuit spacer 126, and the source/drain regions 128 may be formed. The first etch stop layer 140 may be formed on the peripheral circuit gate structure 120. The first etch stop layer 140 may be formed of an insulating material, e.g., silicon nitride, silicon oxynitride, or silicon oxide.

Meanwhile, the dummy gate structure 130 may be formed on the device isolation layer 112, i.e., the field region. As an example, the dummy gate structure 130 may be formed on a portion of the device isolation layer 112 corresponding to an edge portion of the substrate 110. As another example, the dummy gate structure 130 may be formed on a portion of the device isolation layer 112 above which a memory cell array will be disposed in a follow-up process.

Figure 5A:
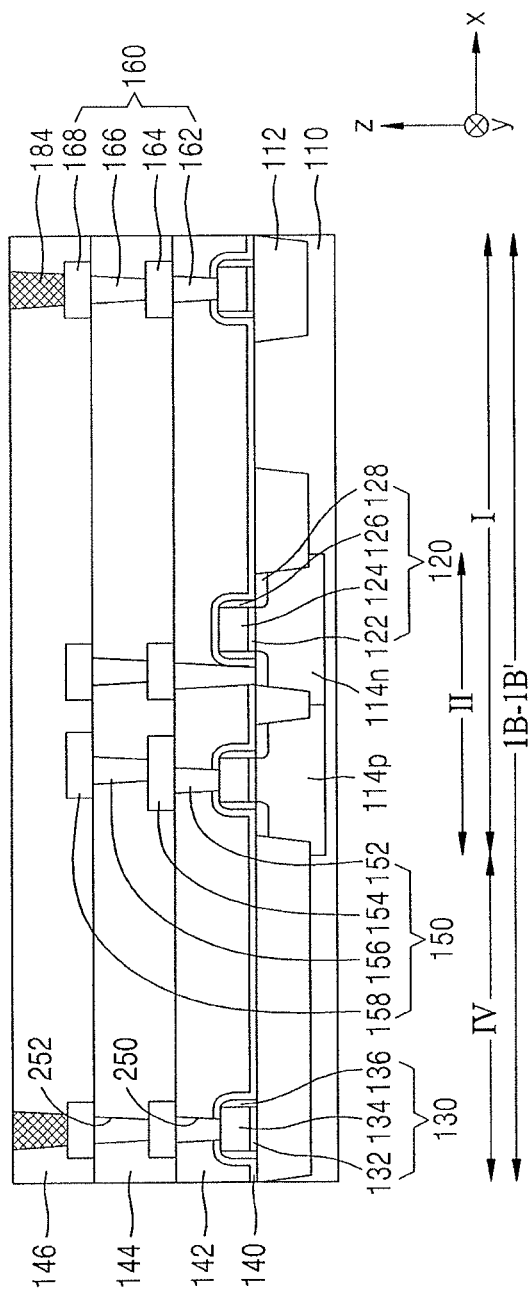
Figure 5B:
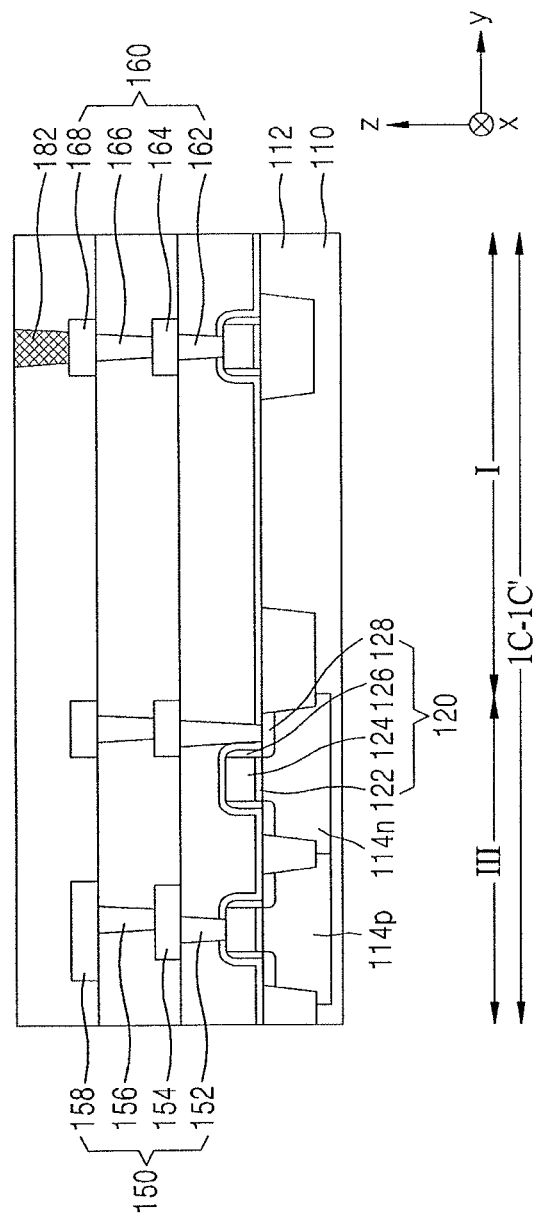

Referring to FIGS. 5A and 5B, the first interlayer insulating layer 142 may be formed on the first etch stop layer 140. Subsequently, a first interconnection contact hole 250 penetrating the first interlayer insulating layer 142 and the first etch stop layer 140 may be formed. The first interconnection contact hole 250 may be formed to expose the upper surface of the peripheral circuit gate electrode 124 or the source/drain regions 128. Subsequently, the first interconnection contact hole 250 is filled with a conductive material (not shown), and then the conductive material is planarized until the upper surface of the first interlayer insulating layer 142 is exposed so that the first interconnection contact 152 may be formed in the first interconnection contact hole 250.

A conductive layer (not shown) is formed on the first interlayer insulating layer 142 and then patterned so that the first lower interconnection layer 154 electrically connected to the first interconnection contact 152 may be formed. The second interlayer insulating layer 144 may be formed on the first lower interconnection layer 154 and the first interlayer insulating layer 142. A second interconnection contact hole 252 penetrating the second interlayer insulating layer 144 and exposing the upper surface of the first lower interconnection layer 154 may be formed. Subsequently, the second interconnection contact hole 252 is filled with a conductive material (not shown), and then the conductive material is planarized until the upper surface of the second interlayer insulating layer 144 is exposed so that the second interconnection contact 156 may be formed in the second interconnection contact hole 252.

A conductive layer (not shown) is formed on the second interlayer insulating layer 144 and then patterned so that the second lower interconnection layer 158 electrically connected to the second interconnection contact 156 may be formed. The third interlayer insulating layer 146 may be formed on the second lower interconnection layer 158 and the second interlayer insulating layer 144.

In exemplary embodiments, the first to third interlayer insulating layers 142, 144, and 146 may be formed of insulating materials, e.g., silicon nitride, silicon oxynitride, and silicon oxide. The lower interconnection layers 154 and 158 and the interconnection contacts 152 and 156 may be formed of metals, e.g., W, Mo, Ti, Co, Ta, and Ni, and conductive materials, e.g., tungsten silicide, titanium silicide, cobalt silicide, tantalum silicide, and nickel silicide. By performing the above-described process, the lower interconnection structure 150 may be formed.

Meanwhile, by performing processes similar to the process of forming the lower interconnection layers 154 and 158 and the interconnection contacts 152 and 156, the first and second dummy interconnection contacts 162 and 166 and the first and second dummy interconnection layers 164 and 168 may be formed on the dummy gate structure 130. Accordingly, the dummy interconnection structure 160 may be formed.

First and second buried contact holes (not shown) exposing the upper surface of the second dummy interconnection layer 168 are formed in the third interlayer insulating layer 146 and filled with a conductive material so that the first and second buried contacts 182 and 184 contacting the second dummy interconnection layer 168 may be formed.

Figure 6A:
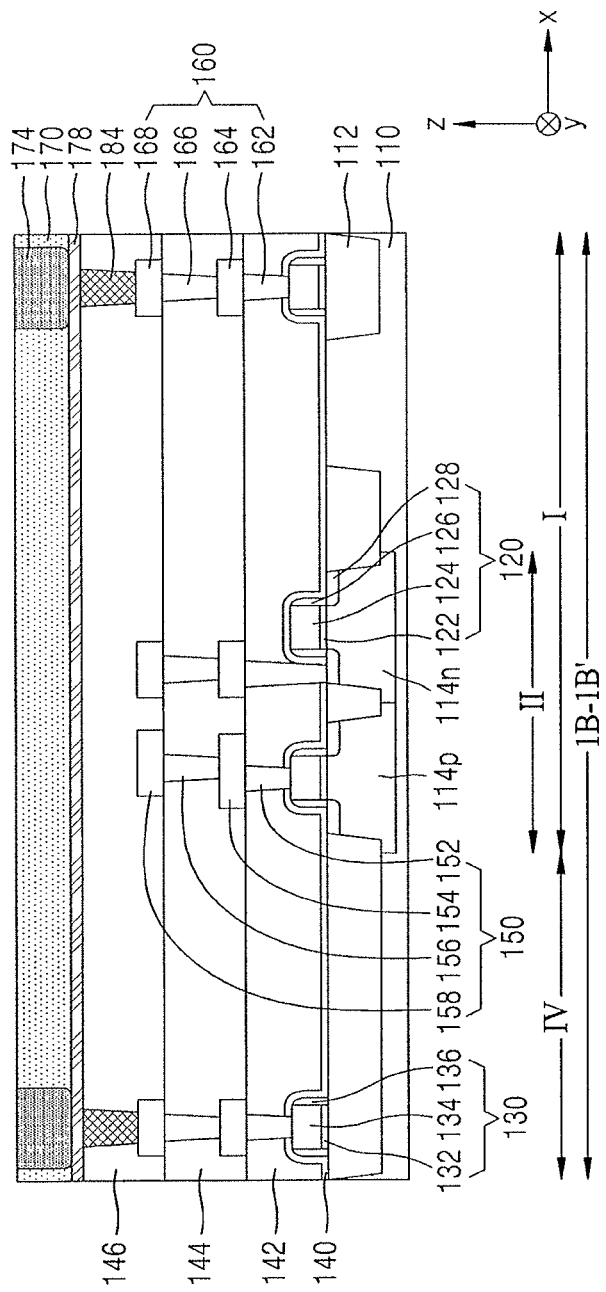
Figure 6B:
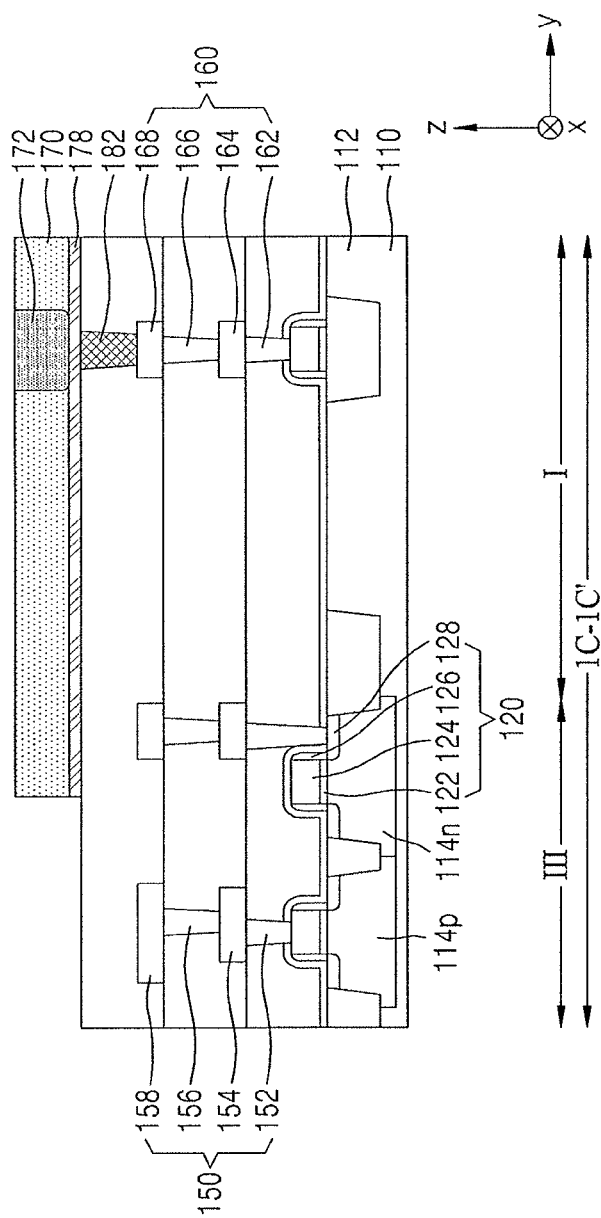

Referring to FIGS. 6A and 6B, the barrier metal layer 178 is formed on the third interlayer insulating layer 146 and the first and second buried contacts 182 and 184. For example, the barrier metal layer 178 may be formed of, e.g., Ti, Ta, titanium nitride, and tantalum nitride.

The first semiconductor layer 170 may be formed on the barrier metal layer 178. The first semiconductor layer 170 may be formed of polysilicon doped with a first impurity by using a chemical vapour deposition (CVD) process, an atomic layer deposition (ALD) process, a physical vapour deposition (PVD) process, or so on. The first semiconductor layer 170 may be formed to have a thickness of about 20 nm to about 500 nm, but the thickness of the first semiconductor layer 170 is not limited thereto. In the process of forming the first semiconductor layer 170, in situ-doping with the first impurity may be performed, or after the first semiconductor layer 170 is formed, doping with the first impurity may be performed by an ion implantation process. The first impurity may be a p-type impurity.

The first semiconductor layer 170 is doped with a second impurity by using a first ion implantation mask (not shown) so that the common source region 172 may be formed in the first semiconductor layer 170. The second impurity may be an n-type impurity. The common source region 172 may be formed to extend in the first direction, and the first buried contact 182 may be placed under the common source region 172. Subsequently, the first ion implantation mask may be removed.

An edge portion of the first semiconductor layer 170 is doped with a third impurity by using a second ion implantation mask (not shown) so that the p+ well 174 may be formed in the first semiconductor layer 170. The third impurity may be a p-type impurity. A plurality of p+ wells 174 may be spaced apart in the second direction, and the second buried contact 184 may be placed under at least one of the plurality of p+ wells 174. Subsequently, the second ion implantation mask may be removed.

Meanwhile, in the process of implanting the second and third impurities, the common source region 172 and the p+ well 174 may be formed to have profiles of the concentrations of the second and third impurities that increase in a vertically downward direction from the upper surface of the first semiconductor layer 170. Accordingly, portions of the common source region 172 and the p+ well 174 that come in contact with the barrier metal layer 178 may have the highest second and third impurity concentrations, and the common source region 172 and the p+ well 174 may form ohmic contacts with the barrier metal layer 178 formed thereunder. Therefore, it is possible to reduce the electrical resistance between the common source region 172 and the first buried contact 182 and the electrical resistance between the p+ well 174 and the second buried contact 184.

Figure 7:
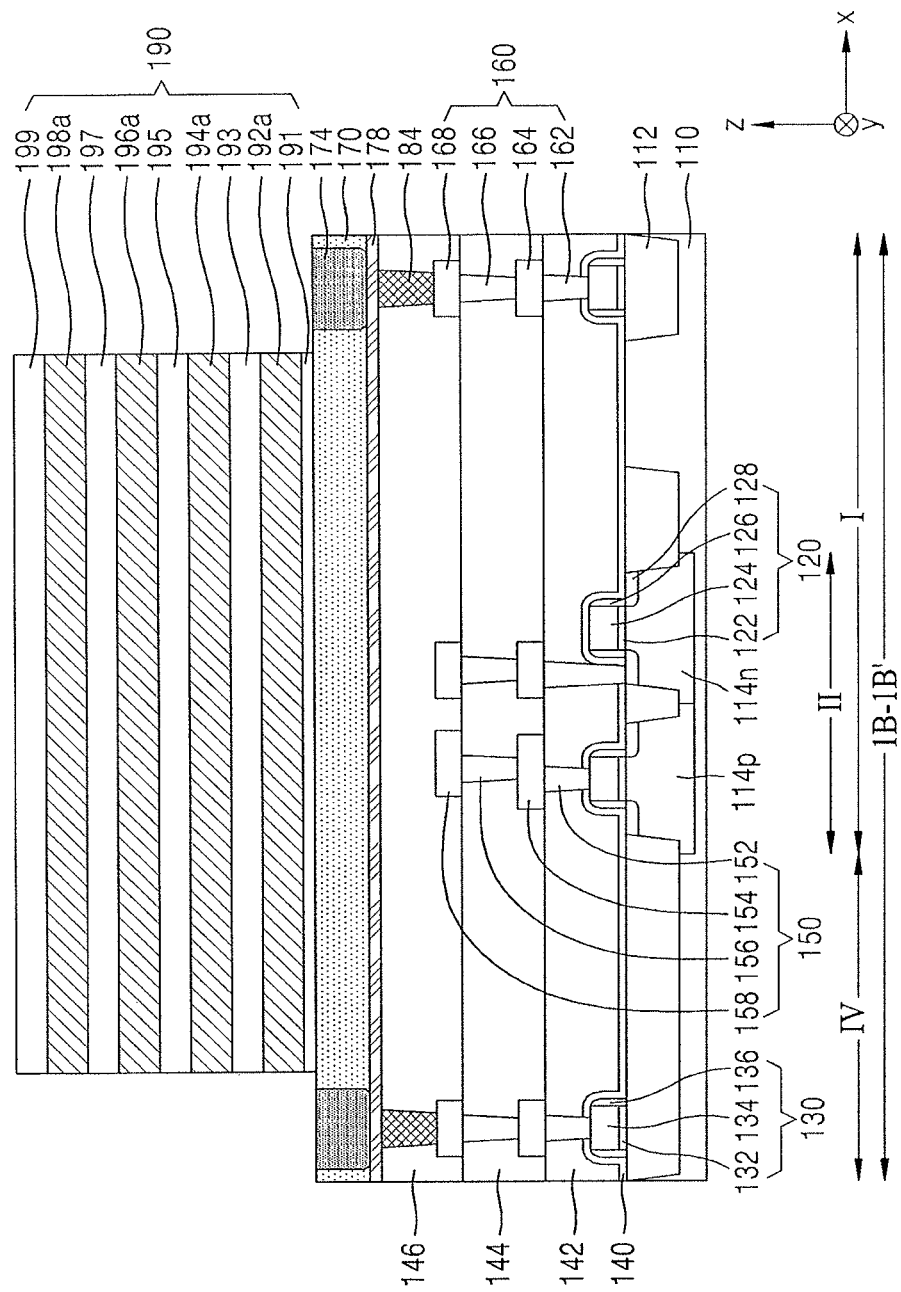

Referring to FIG. 7, a preliminary gate stack structure 190 may be formed by alternately stacking the first to fifth insulating layers 191, 193, 195, 197, and 199 and first to fourth preliminary gate layers 192a, 194a, 196a, and 198a on the first semiconductor layer 170. The insulating layers 191, 193, 195, 197, and 199 may be formed of, e.g., silicon oxide, silicon nitride, and silicon oxynitride to have a predetermined height. Also, the preliminary gate layers 192a, 194a, 196a, and 198a may be formed of, e.g., silicon oxide, silicon carbide, and polysilicon to have a predetermined height. The preliminary gate layers 192a, 194a, 196a, and 198a may be preliminary layers and sacrificial layers for forming a ground selection line (192 in FIG. 11A), a plurality of word lines (194 and 196 in FIG. 11A), and a string selection line (198 in FIG. 11A), respectively. The number of the preliminary gate layers 192a, 194a, 196a, and 198a may be appropriately selected for the number of the ground selection line, the word lines, and the string selection line.

Figure 8:
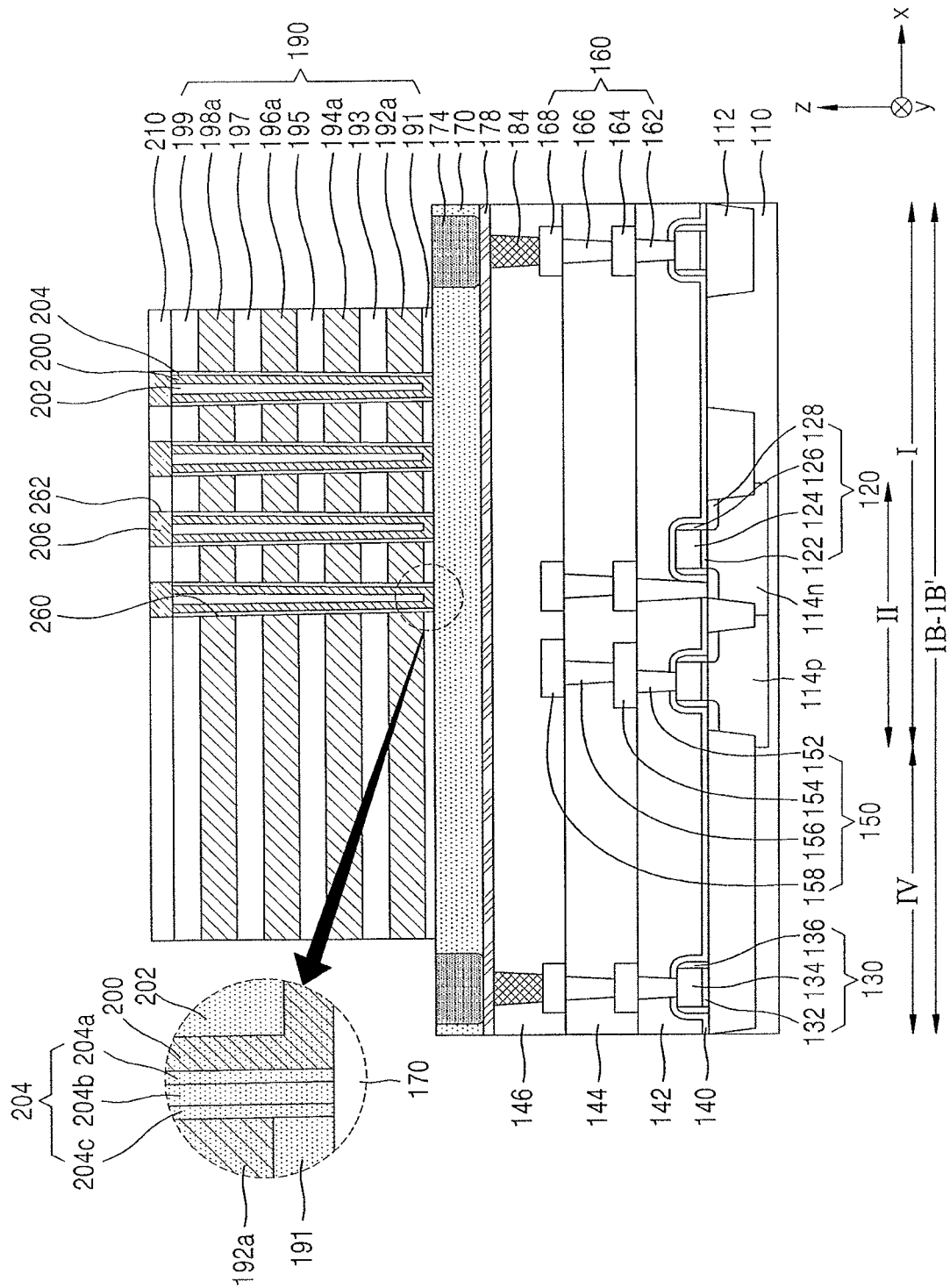

Referring to FIG. 8, a channel hole 260 may be formed to penetrate the preliminary gate stack structure 190 and extend in the third direction, which is perpendicular to the main surface of the substrate 110. A plurality of channel holes 260 may be formed at intervals in the first and second directions, and the upper surface of the semiconductor layer 170 under the channel holes 260 may be exposed.

FIG. 8 illustrates that portions of the first semiconductor layer 170 exposed under the channel holes 260 have a planar shape. Unlike this, however, the portions of the first semiconductor layer 170 under the channel holes 260 may be over-etched, and recesses (not shown) may be formed at the upper-surface portions of the first semiconductor layer 170.

On the sidewalls of the channel holes 260, the upper surface of the first semiconductor layer 170 exposed under the channel holes 260, and the preliminary gate stack structure 190, a preliminary gate insulating layer (not shown) may be formed. Subsequently, by anisotropically etching the preliminary gate insulating layer, portions of the preliminary gate insulating layer formed on the preliminary gate stack structure 190 and on the upper surface of the first semiconductor layer 170 under the channel holes 260 may be removed so that the gate insulating layers 204 may be formed on the sidewalls of the channel holes 260. Accordingly, the upper surface of the first semiconductor layer 170 may be exposed again under the channel holes 260. Each gate insulating layer 204 may be formed to have a structure in which the blocking insulating film 204c, the charge storage film 204b, and the tunnel insulating film 204a are stacked in sequence. Optionally, a barrier metal layer (not shown) may be further formed on the sidewall of each channel hole 260 before the blocking insulating film 204c is formed.

Each gate insulating layer 204 may be, e.g., conformally, formed on the sidewall of each channel hole 260 to have a predetermined thickness so that the channel hole 260 may not be fully filled with the gate insulating layer 204.

Subsequently, a conductive layer (not shown) and an insulating layer (not shown) are sequentially formed on the inner wall of each channel hole 260 and the preliminary gate stack structure 190, and then upper portions of the conductive layer and the insulating layer are planarized until the upper surface of the preliminary gate stack structure 190 is exposed so that a channel layer 200 and a buried insulating layer 202 may be formed on the inner wall of the channel hole 260. The bottom surfaces of the channel layers 200 may come in contact with the upper surface of the first semiconductor layer 170 exposed under the channel holes 260, and the outer surfaces of the channel layers 200 may come in contact with the gate insulating layers 204. The channel layers 200 may be formed of polysilicon doped with an impurity by a CVD process, a low-pressure chemical vapour deposition (LPCVD) process, or an ALD process, or may be formed of undoped polysilicon. Each buried insulating layer 202 may be formed of an insulating material, e.g., silicon oxide, silicon nitride, or silicon oxynitride, by a CVD process, an LPCVD process, or an ALD process.

Subsequently, the second etch stop layer 210 covering the upper surfaces of the channel layers 200, the buried insulating layers 202, and the gate insulating layers 204 may be formed on the preliminary gate stack structure 190. The second etch stop layer 210 may be formed of, e.g., silicon nitride, silicon oxide, silicon oxynitride, or so on.

After drain holes 262 exposing the upper surfaces of the channel layers 200 and the buried insulating layers 202 are formed in the second etch stop layer 210, a conductive layer (not shown) filling the drain holes 262 may be formed and planarized, so that the drain regions 206 may be formed. The upper surfaces of the drain regions 206 may be formed at the same level as the upper surface of the second etch stop layer 210.

Figure 9A:
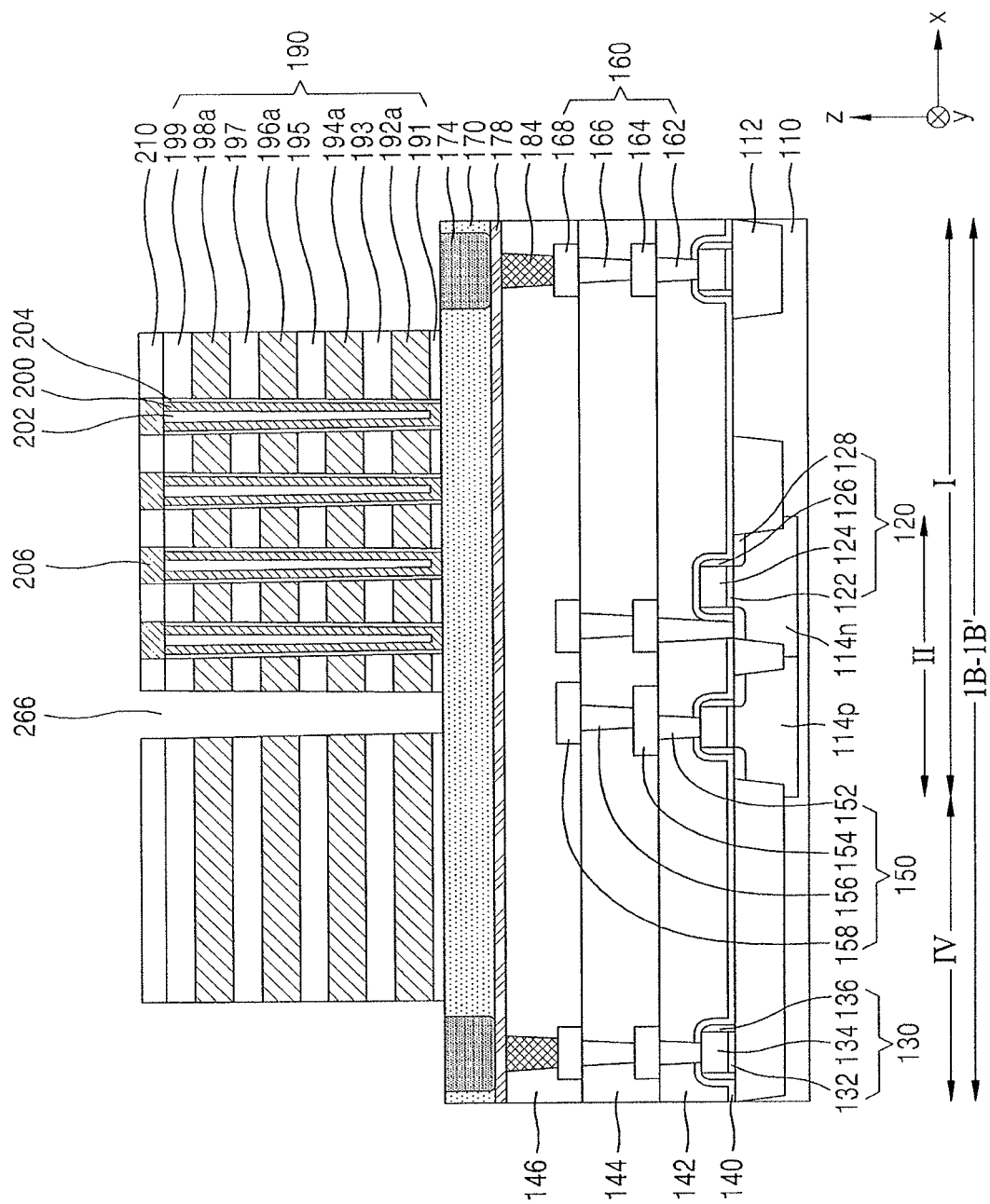
Figure 9B:
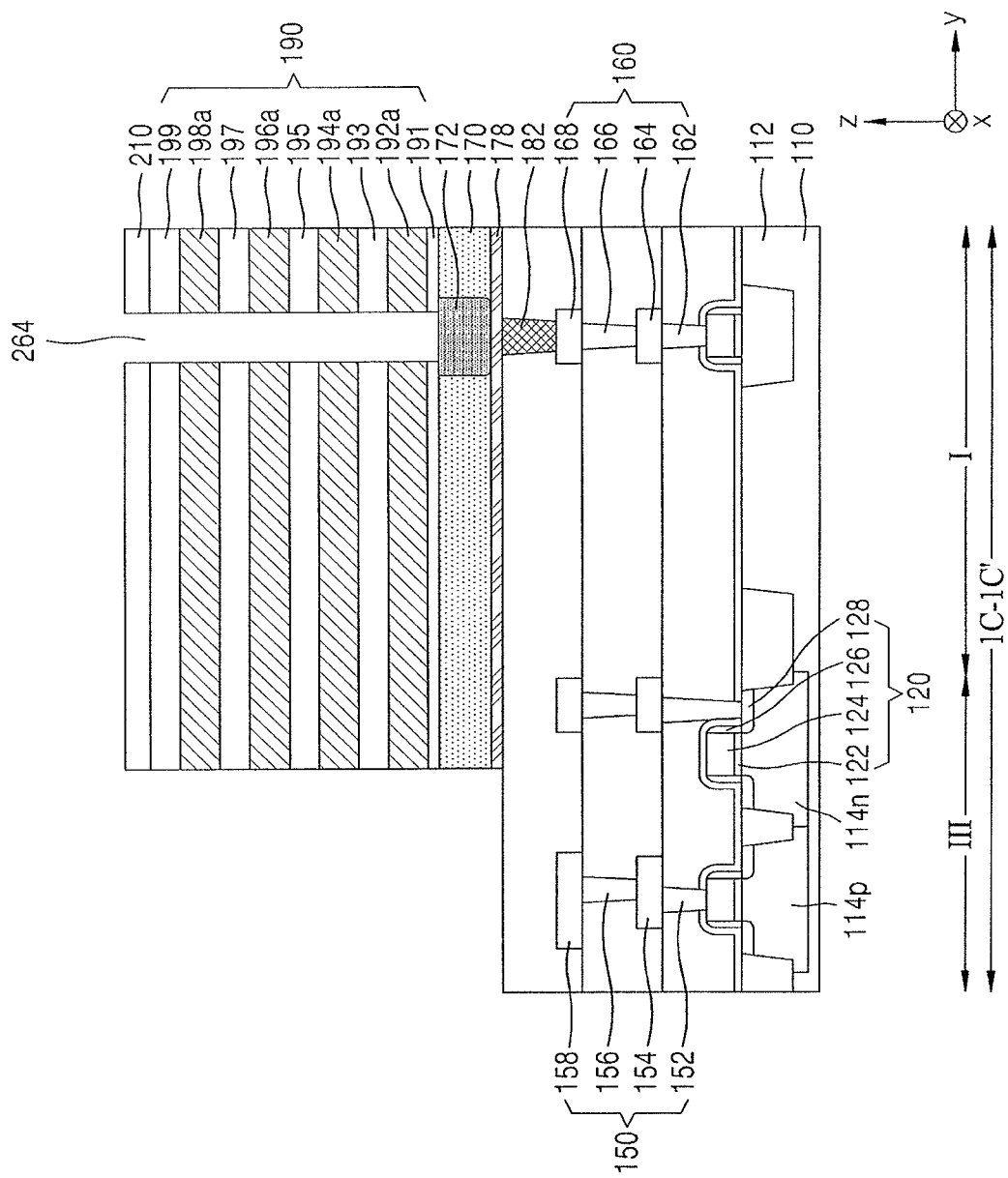

Referring to FIGS. 9A and 9B, a first opening 264 and a preliminary vertical contact hole 266 may be formed in the second etch stop layer 210 and the preliminary gate stack structure 190. The first opening 264 may extend in the y direction and expose the upper surface of the common source region 172, and the vertical contact hole 266 may expose the upper surface of the first semiconductor layer 170. The vertical contact hole 266 may be formed at a predetermined distance from the channel layer 200 in the first direction.

Figure 10:
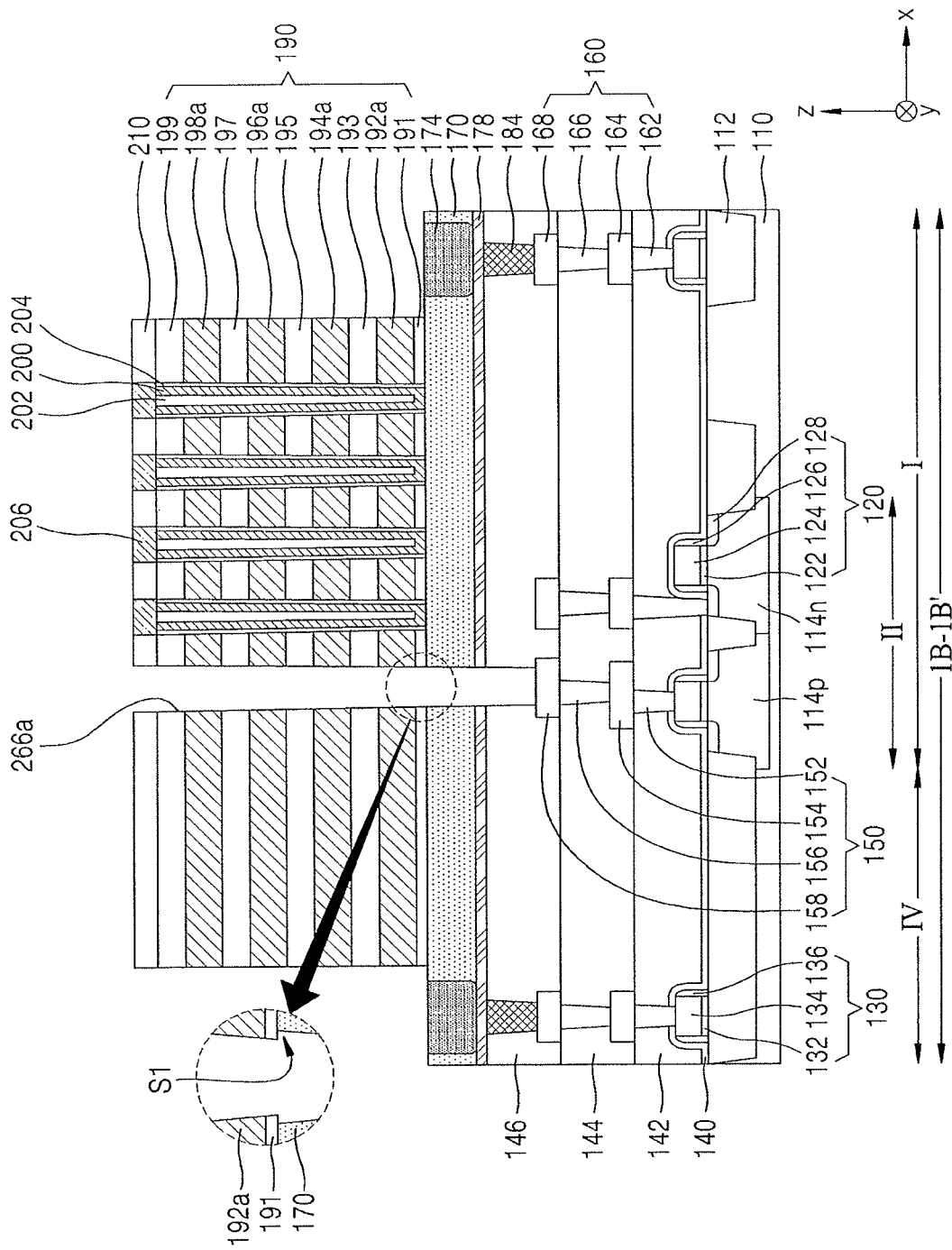

Referring to FIG. 10, by sequentially removing a portion of the first semiconductor layer 170, a portion of the barrier metal layer 178, and a portion of the third interlayer insulating layer 146 exposed under the preliminary vertical contact hole (266 in FIG. 9A), a vertical contact hole 266a that is the preliminary vertical contact hole 266 expanded in the downward direction may be formed. Under the vertical contact hole 266a, the upper surface of the second lower interconnection layer 158 may be exposed.

According to exemplary embodiments, isotropic etching and/or anisotropic etching may be used in the process of forming the vertical contact hole 266a. When a contact hole having a large aspect ratio is formed at once at a single etching process, a width of a bottom portion of the contact hole may decrease due to a slope of the sidewall of the contact hole. When the expanded vertical contact hole 266a is formed by a two-step etching process, the vertical contact hole 266a may be expanded in the lateral direction by using isotropic etching characteristics in the process of removing the first semiconductor layer 170, so the width of a bottom portion of the vertical contact hole 266a may increase even if the aspect ratio of the vertical contact hole 266a is large. In this case, a step difference S1 may be formed on the sidewall of the vertical contact hole 266a from the upper surface of the first semiconductor layer 170.

Meanwhile, unlike in FIGS. 9A to 10, the vertical contact hole 266a may be formed after the first opening 264 is formed. In this case, after the first opening 264 is formed, the vertical contact hole 266a may be formed by sequentially etching the second etch stop layer 210, the preliminary gate stack structure 190, the first semiconductor layer 170, the barrier metal layer 178, and the third interlayer insulating layer 146.

Figure 11A:
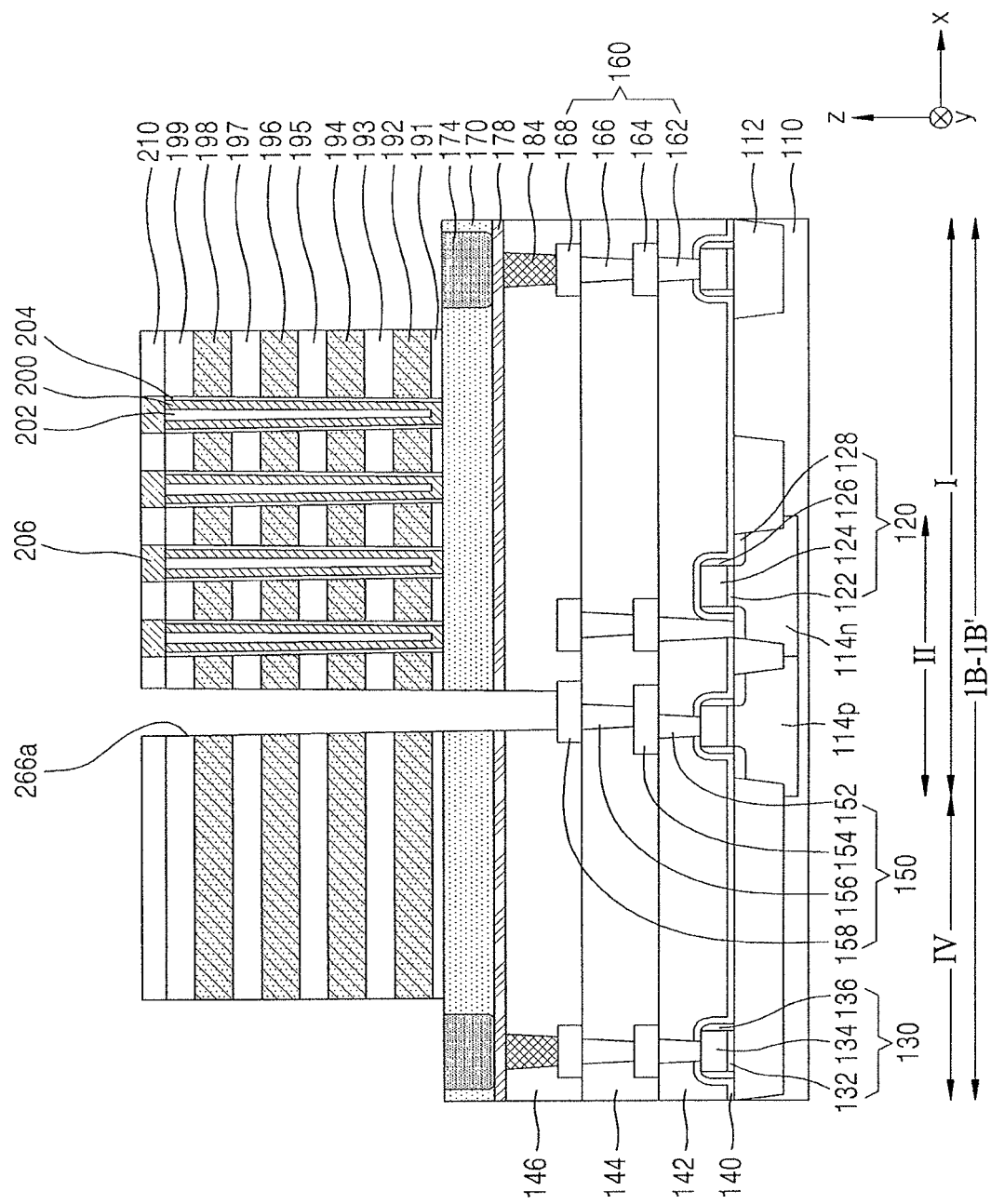
Figure 11B:
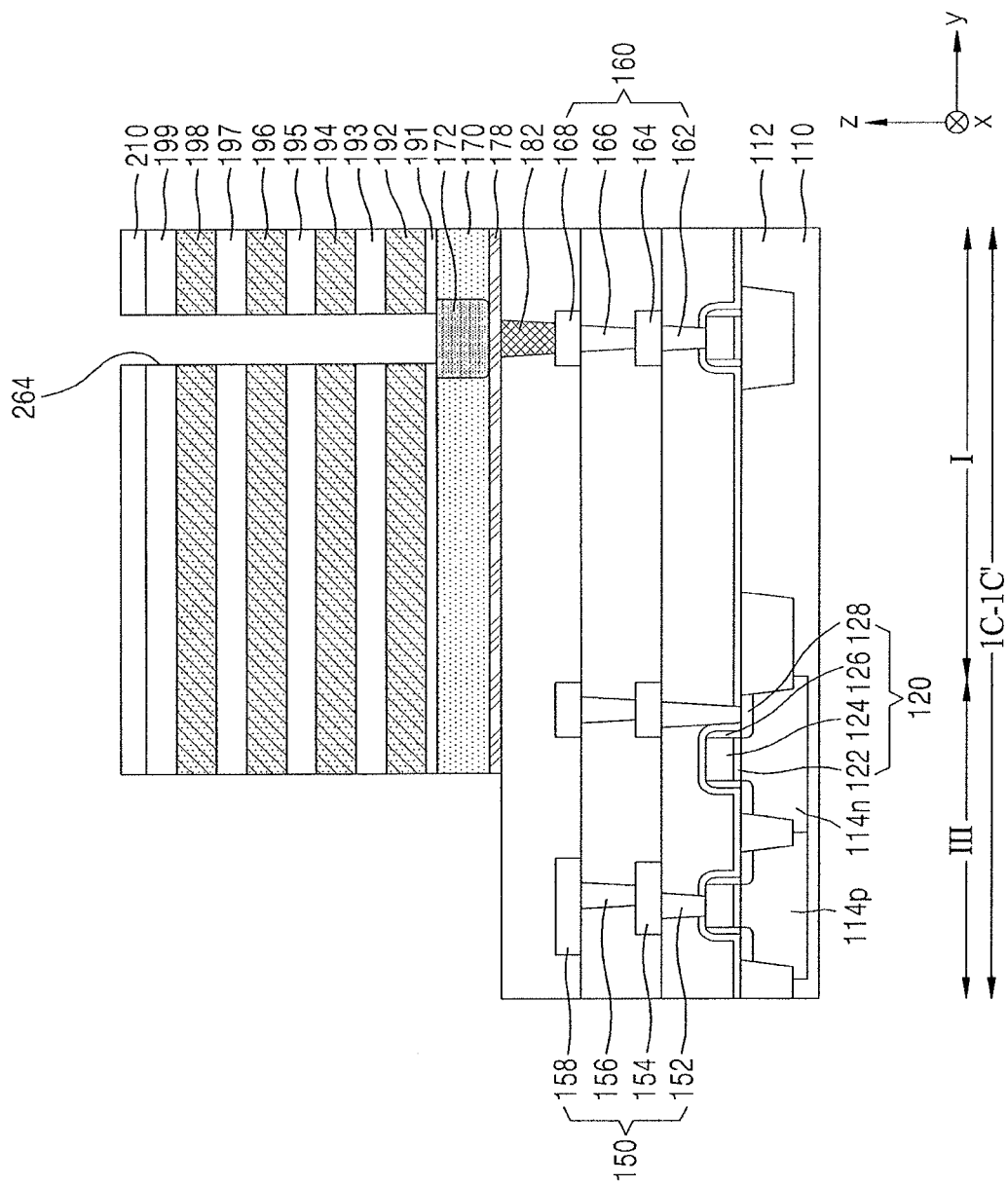

Referring to FIGS. 11A and 11B, by performing a silicidation process on the preliminary gate stack structure 190, the first to fourth preliminary gate layers 192a, 194a, 196a, and 198a may be converted into the ground selection line 192, the first word line 194, the second word line 196, and the string selection line 198, respectively. At this time, the ground selection line 192, the first and second word lines 194 and 196, and the string selection line 198 may include metal silicide materials, e.g., tungsten silicide, tantalum silicide, cobalt silicide, and nickel silicide.

Alternatively, by selectively removing only the gate layers 192a, 194a, 196a, and 198a exposed through the first opening 264 and filling the spaces between the insulating layers 191, 193, 195, 197, and 199 with a conductive material, the ground selection line 192, the word lines 194 and 196, and the string selection line 198 may be formed. At this time, the ground selection line 192, the word lines 194 and 196, and the string selection line 198 may be formed of metal materials, e.g., W, Ta, Co, and Ni. Optionally, before the process of filling the spaces with the conductive material, a barrier metal layer (not shown) may be further formed in the spaces between the insulating layers 191, 193, 195, 197, and 199.

Figure 12A:
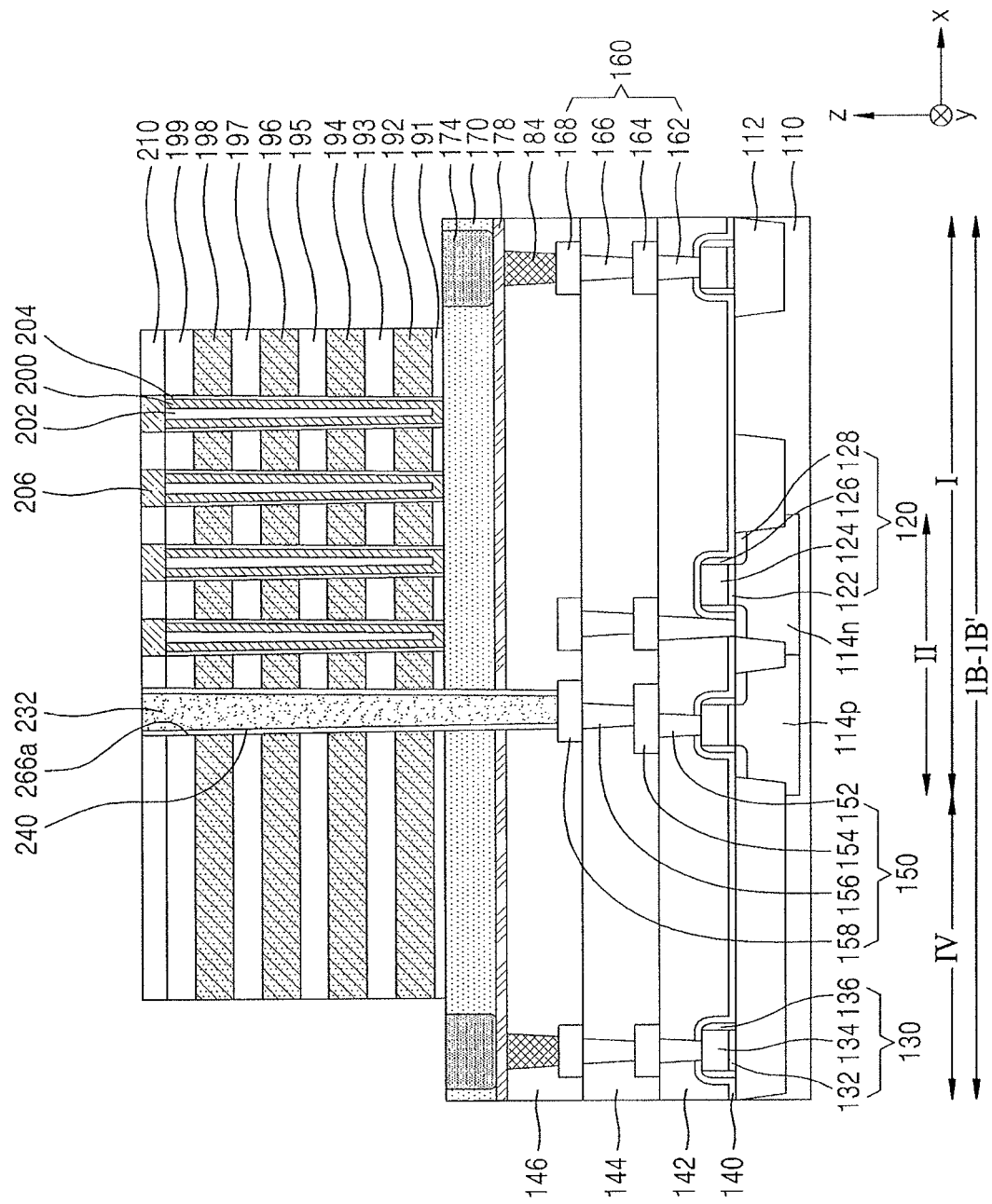
Figure 12B:
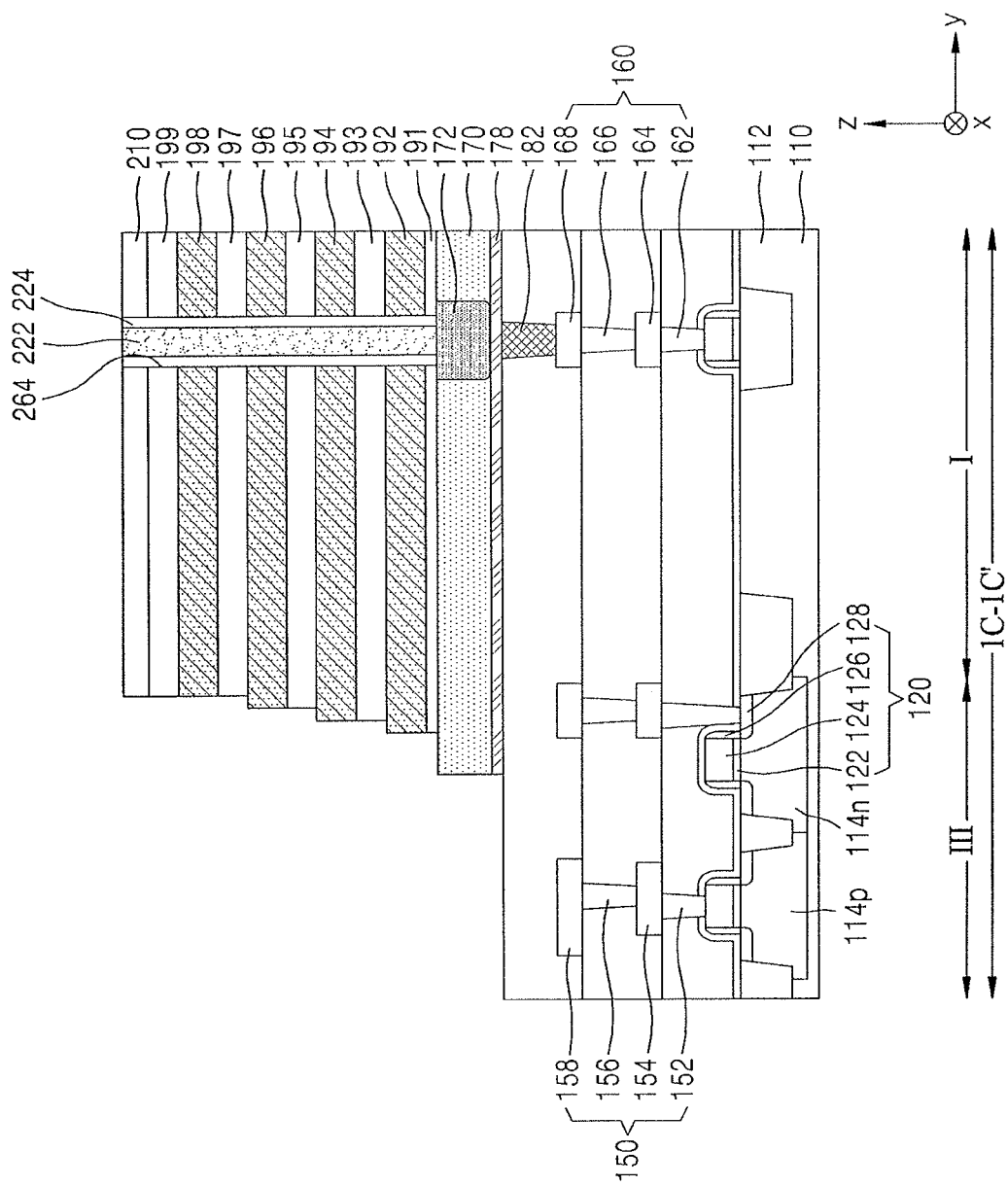

Referring to FIGS. 12A and 12B, an insulating layer (not shown) is formed on the inner walls of the first opening 264 and the vertical contact hole 266a and then anisotropically etched so that the common source line spacers 224 and the vertical contact spacer 240 may be formed on the sidewalls of the first opening 264 and the sidewall of the vertical contact hole 26a, respectively. The common source line spacers 224 and the vertical contact spacer 240 may be formed of an insulating material, e.g., silicon oxide, silicon nitride, or silicon oxynitride.

Subsequently, a conductive layer (not shown) filling the first opening 264 and the vertical contact hole 266a is formed. An upper portion of the conductive layer is planarized until the upper surface of the second etch stop layer 210 is exposed, so that the common source line 222 and the vertical contact 232 may be formed on the inner walls of the first opening 264 and the vertical contact hole 266a, respectively.

Figure 13:
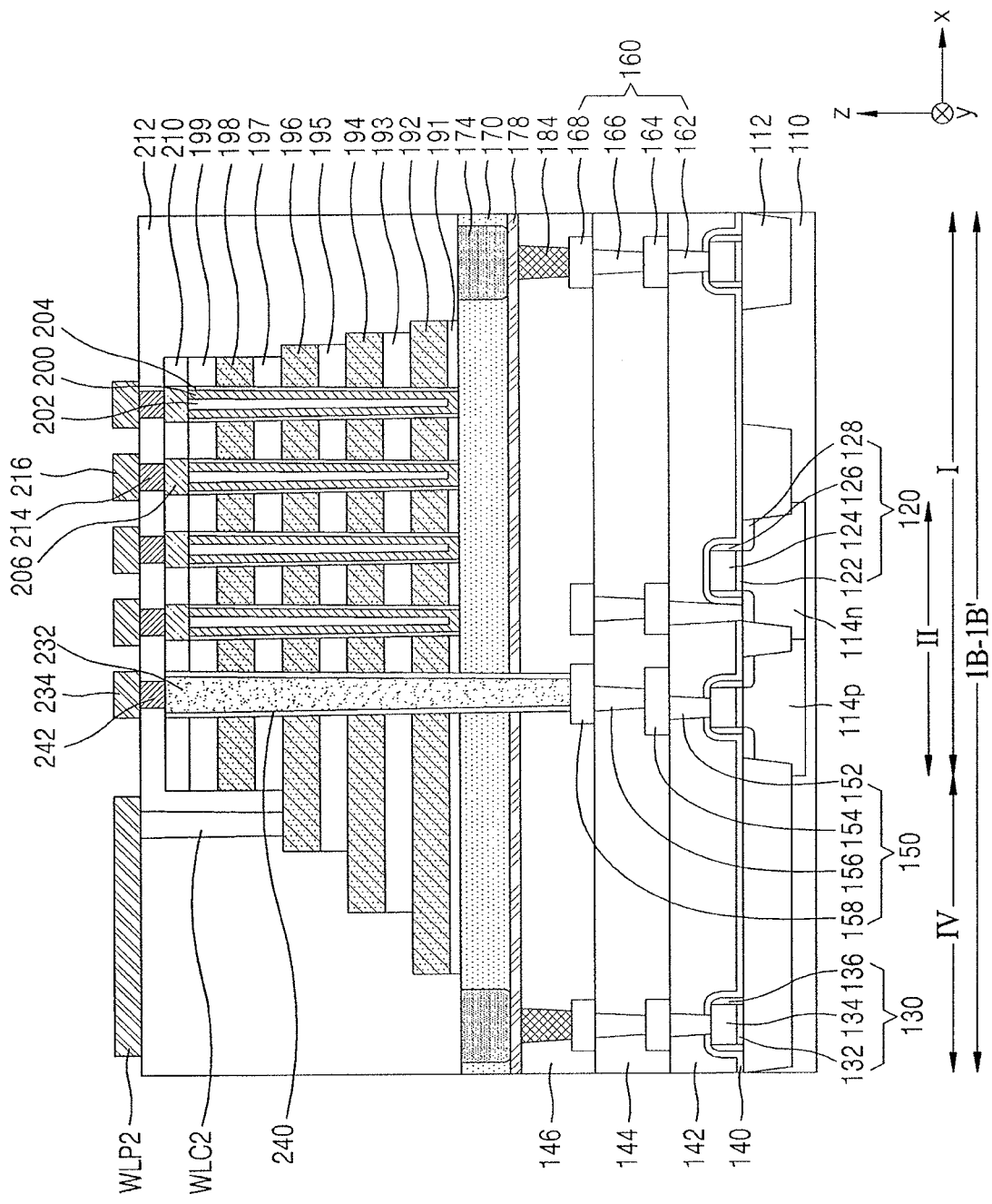

Referring to FIG. 13, the ground selection line 192, the word lines 194 and 196, and the string selection line 198 may be patterned by a plurality of patterning processes in which a mask (not shown) is used. At this time, the sidewalls of the fifth and fourth insulating layers 199 and 197 may be patterned to be aligned with the sidewall of the string selection line 198, and the sidewalls of the third and second insulating layers 195 and 193 may be patterned to be aligned with the sidewalls of the second and first word lines 196 and 194, respectively. Also, the sidewall of the first insulating layer 191 may be patterned to be aligned with the sidewall of the ground selection line 192.

Subsequently, the fourth interlayer insulating layer 212 may be formed to cover the second etch stop layer 210 and the sidewalls of the patterned ground selection line 192, the patterned word lines 194 and 196, and the patterned string selection line 198. A dummy bit line contact hole (not shown) and bit line contact holes (not shown) exposing the upper surfaces of the vertical contact 232 and the drain regions 206 are formed in the fourth interlayer insulating layer 212 and filled with a conductive material, and an upper portion of the conductive material is planarized so that the dummy bit line contact 242 and the bit line contacts 214 may be formed.

In the planarized fourth interlayer insulating layer 212 of the bonding pad region IV, string selection line contact holes (not shown) exposing the string selection line 198, word line contact holes (not shown) exposing the word lines 194 and 196, and a ground selection line contact hole (not shown) exposing the ground selection line 192 may be formed. Also, in the second peripheral circuit region III, a peripheral circuit contact hole (not shown) exposing the second lower interconnection layer 158 may be formed. After the string selection line contact holes, the word line contact holes, the ground selection line contact hole, and the peripheral circuit contact hole are filled with a conductive material, an upper portion of the conductive material is planarized until the upper portion of the fourth interlayer insulating layer 212 is exposed so that the string selection line contacts SSLC, the word line contacts WLC1 and WLC2, the ground selection line contacts GSLC, and the dummy bit line contact 242 and the bit line contacts 214 may be formed.

A conductive layer (not shown) is formed on the fourth interlayer insulating layer 212 and then patterned so that the bit lines 216, the dummy bit line 234, the string selection line pads SSLP, the word line pads WLP1 and WLP2, the ground selection line pads GSLP, and the peripheral circuit interconnection 244 may be formed to be connected to the bit line contacts 214, the dummy bit line contact 242, the string selection line contacts SSLC, the word line contacts WLC1 and WLC2, the ground selection line contacts GSLC, and the peripheral circuit contact 243 illustrated in FIG. 1C, respectively.

Referring back to FIGS. 1A to 1C, the fifth interlayer insulating layer 218 covering the bit lines 216, the dummy bit line 234, the string selection line pads SSLP, the word line pads WLP1 and WLP2, the ground selection line pads GSLP, and the peripheral circuit interconnection 244 may be formed on the fourth interlayer insulating layer 212. A third interconnection contact hole (not shown) exposing the supper surface of the dummy bit line 234 is formed in the fifth interlayer insulating layer 218 and then filled with a conductive material so that the third interconnection contact 238 may be formed.

The upper interconnection layer 236 electrically connected to the third interconnection contact 238 may be formed on the fifth interlayer insulating layer 218. The upper interconnection layer 236 may be formed of a material having a low sheet resistance. For example, the upper interconnection layer 236 may be formed of a material having a lower sheet resistance than that of the lower interconnection layers 154 and 158. The upper interconnection layer 236 may be formed of a metal, for example, Al, Cu, or Ni.

In other embodiments, after a second opening (not shown) is formed by forming and patterning a sixth interlayer insulating layer (not shown), a barrier metal layer (not shown) may be formed to have a predetermined thickness on the inner wall of the second opening. Subsequently, a conductive layer (not shown) filling the second opening is formed on the barrier metal layer and planarized until the upper surface of the sixth interlayer insulating layer is exposed so that the upper interconnection layer 236 may be formed. In this case, the side surfaces and the bottom surface of the upper interconnection layer 236 come in contact with the barrier metal layer, thereby preventing penetration of impurity atoms from the upper interconnection layer 236 into the fifth interlayer insulating layer 218 or the sixth interlayer insulating layer.

The upper interconnection layer 236 may electrically connect the peripheral circuit gate structure 120 formed in the first peripheral circuit region II with the memory cells in the memory cell array region I by using a material having a low sheet resistance. In general, when the upper interconnection layer 236 includes a material having a low sheet resistance, the upper interconnection layer 236 may have a low melting point and may be degraded or damaged in processes for forming a memory cell array performed at high temperature. However, according to embodiments, since the upper interconnection layer 236 is formed after a memory cell array is formed, it is possible to prevent the upper interconnection layer 236 from being exposed to high temperature and efficiently reduce the resistance of the peripheral circuit interconnection structure 230 including the upper interconnection layer 236.

By the above-described processes, the semiconductor device 1000 may be formed.

By way of summary and review, according to example embodiments, peripheral circuits are disposed under a memory cell array, a metal interconnection having low resistance is formed on the memory cell, and the peripheral circuits and the metal interconnection are connected to each other through a vertical contact. Thus, the degree of integration of a memory device may increase.

Further, a dummy gate structure is formed on a portion of a substrate in which the memory cell array is not formed, and connected to a common source region and a p+ well. By using the dummy gate structure as an interconnection to the common source region and the p+ well, it is possible to reduce malfunctions of the memory device.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:
1. A semiconductor device, comprising:
a first substrate including a first region and a second region;
a first lower interconnection structure on the first region of the first substrate;
a second lower interconnection structure on the second region of the first substrate;
a second substrate on or above the first lower interconnection structure;
a memory cell array on the second substrate;
a first vertical contact penetrating through the memory cell array and the second substrate, and contacting the first lower interconnection structure;
a second vertical contact contacting the second lower interconnection structure; and
a channel layer penetrating through the memory cell array and contacting the second substrate.

2. The semiconductor device of claim 1, further comprising:
- at least one insulating layer on the first substrate; and
- a second insulating layer on the at least one insulating layer,
- wherein the first lower interconnection structure and the second lower interconnection structure are in the at least one insulating layer, and
- the second vertical contact penetrates the second insulating layer.

3. The semiconductor device of claim 2, wherein the second substrate is on the at least one insulating layer.

4. The semiconductor device of claim 1, wherein the second substrate is directly above the first region of the first substrate and does not vertically overlap the second region of the first substrate.

5. The semiconductor device of claim 1, wherein the memory cell array is directly above the first region of the first substrate and does not vertically overlap the second region of the first substrate.

6. The semiconductor device of claim 1, further comprising an upper interconnection layer electrically connected to the first lower interconnection structure via the first vertical contact.

7. The semiconductor device of claim 1, wherein the second vertical contact does not contact the memory array and the second substrate.

8. The semiconductor device of claim 1, wherein the second vertical contact is directly above the second region of the first substrate.

9. The semiconductor device of claim 1, wherein the channel layer is U-shaped.

10. The semiconductor device of claim 9, further comprising a buried insulating layer filling an interior space of the U-shaped channel layer.

11. The semiconductor device of claim 1, wherein a bottom surface of the channel layer directly contacts an upper surface of the second substrate.

12. The semiconductor device of claim 1, wherein an upper surface of the second substrate has a recess at a contacting area where the channel layer contacts the second substrate.

\* \* \* \* \*